US010934208B2

(12) United States Patent
Ahmed et al.

(10) Patent No.: US 10,934,208 B2
(45) Date of Patent: Mar. 2, 2021

(54) EDGE AND CORNER-STRENGTHENED ARTICLES AND METHODS FOR MAKING SAME

(71) Applicant: CORNING INCORPORATED, Corning, NY (US)

(72) Inventors: Izhar Zahoor Ahmed, Cupertino, CA (US); Guangli Hu, Berkeley Heights, NJ (US); Rostislav Vatchev Roussev, Painted Post, NY (US); Po-Jen Shih, Vancouver, WA (US); Irene Marjorie Slater, Lindley, NY (US); Vijay Subramanian, Painted Post, NY (US); Bin Zhang, Penfield, NY (US); Sam Samer Zoubi, Horseheads, NY (US)

(73) Assignee: CORNING INCORPORATED, Corning, NY (US)

( * ) Notice: Subject to any disclaimer, the term of this patent is extended or adjusted under 35 U.S.C. 154(b) by 684 days.

(21) Appl. No.: 15/567,530

(22) PCT Filed: Apr. 21, 2016

(86) PCT No.: PCT/US2016/028566
§ 371 (c)(1),
(2) Date: Oct. 18, 2017

(87) PCT Pub. No.: WO2016/172292
PCT Pub. Date: Oct. 27, 2016

(65) Prior Publication Data
US 2018/0290921 A1   Oct. 11, 2018

Related U.S. Application Data

(60) Provisional application No. 62/150,563, filed on Apr. 21, 2015.

(51) Int. Cl.
*C03C 21/00* (2006.01)
*H05K 5/00* (2006.01)
*H05K 5/03* (2006.01)

(52) U.S. Cl.
CPC ......... *C03C 21/002* (2013.01); *H05K 5/0017* (2013.01); *H05K 5/03* (2013.01); *C03C 2218/34* (2013.01)

(58) Field of Classification Search
None
See application file for complete search history.

(56) References Cited

U.S. PATENT DOCUMENTS 8,110,279 B2   2/2012   Shashidhar et al.
8,415,013 B2   4/2013   Barefoot et al.
(Continued)

FOREIGN PATENT DOCUMENTS

EP   3339265 A1   6/2018
GB   2474929 A    5/2011
(Continued)

OTHER PUBLICATIONS

Japanese Patent Application No. 2017555247; Machine Translation of the Office Action dated Jan. 29, 2020; Japan Patent Office; 3 Pgs.
(Continued)

*Primary Examiner* — David Sample
(74) *Attorney, Agent, or Firm* — Kevin M. Johnson

(57) ABSTRACT

A strengthened article (and methods for making it) is provided that includes a glass, glass-ceramic or ceramic, having a plurality of primary surfaces, side edges, and a thickness. The article also includes a compressive stress region extending from one of the primary surfaces to a first selected depth in the article; a central region extending from a boundary located at a depth of 200 μm from the primary surfaces and the edges to the centroid of the article; and an outer region
(Continued)

extending between the primary surfaces and edges to the boundary. Further, the maximum principal stress within the outer region is no more than two times the maximum principal stress within the central region. The primary surfaces and side edges may define a plurality of corners, and the corners may be defined by a chamfer, a fillet, or a curved shape.

37 Claims, 9 Drawing Sheets

(56) References Cited

U.S. PATENT DOCUMENTS

| | | | |
|---|---|---|---|
| 8,586,492 B2 | 11/2013 | Barefoot et al. | |
| 8,652,978 B2 | 2/2014 | Dejneka et al. | |
| 8,765,262 B2 | 7/2014 | Gross | |
| 8,776,547 B2 | 7/2014 | Abramov et al. | |
| 8,937,689 B2 | 1/2015 | Prest et al. | |
| 8,969,266 B2 | 3/2015 | Crawley et al. | |
| 9,109,881 B2 | 8/2015 | Roussev et al. | |
| 9,140,543 B1 | 9/2015 | Allan et al. | |
| 9,156,724 B2 | 10/2015 | Gross | |
| 9,290,413 B2 | 3/2016 | Dejneka et al. | |
| 9,346,703 B2 | 5/2016 | Bookbinder et al. | |
| 9,517,967 B2 | 12/2016 | Dejneka et al. | |
| 2011/0129648 A1* | 6/2011 | Gu | C03C 3/093 |
| | | | 428/157 |
| 2012/0236477 A1* | 9/2012 | Weber | B32B 17/06 |
| | | | 361/679.01 |
| 2012/0236526 A1 | 9/2012 | Weber | |
| 2013/0122254 A1* | 5/2013 | Liang | C03C 21/002 |
| | | | 428/156 |
| 2013/0288010 A1* | 10/2013 | Akarapu | B24B 9/10 |
| | | | 428/157 |
| 2014/0065401 A1 | 3/2014 | Donovan et al. | |
| 2015/0147574 A1 | 5/2015 | Allan et al. | |
| 2018/0057400 A1* | 3/2018 | Fukada | C03B 33/02 |

FOREIGN PATENT DOCUMENTS

| | | |
|---|---|---|
| JP | 58114037 A | 7/1983 |
| JP | 9249432 A | 9/1997 |
| JP | 2008007360 A | 1/2008 |
| JP | 2013-506618 A | 2/2013 |
| JP | 2013067555 A | 4/2013 |
| WO | 2012125857 A1 | 9/2012 |
| WO | 2013028492 A1 | 2/2013 |
| WO | 2013163524 A1 | 10/2013 |
| WO | 2014167910 A1 | 10/2014 |

OTHER PUBLICATIONS

Taiwan Patent Application No. 105112462 English Translation of the Office Action and Search Report dated Jul. 26, 2019, Taiwan Patent Office, 2 Pgs.
Chinese Patent Application No. 201680036440.X; English Translation of the First Office Action dated Dec. 3, 2019; China Patent Office; 27 Pgs.
International Search Report and Written Opinion PCT/US2016/028566 dated Jul. 8, 2016.
Japanese Patent Application No. 2017-555347, Office Action dated Nov. 6, 2020, 5 pages (3 pages of English Translation and 2 pages of Original Document); Japanese Patent Office.

* cited by examiner

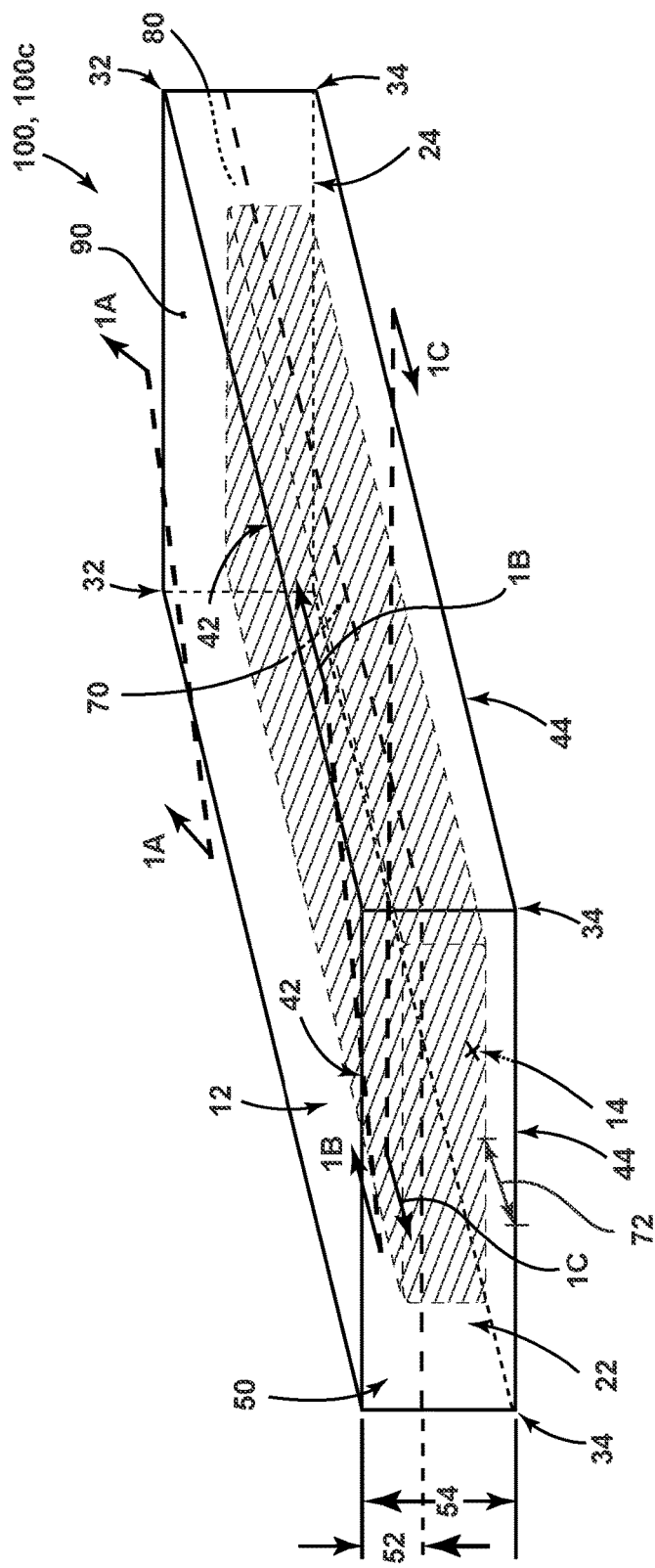
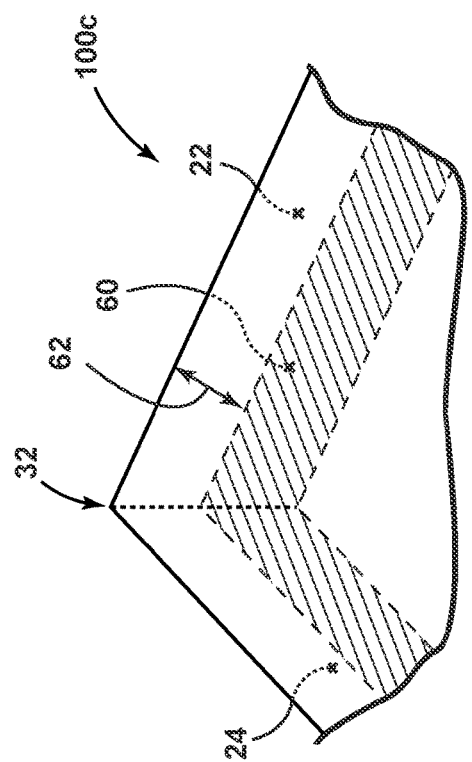
FIG. 1
FIG. 1A

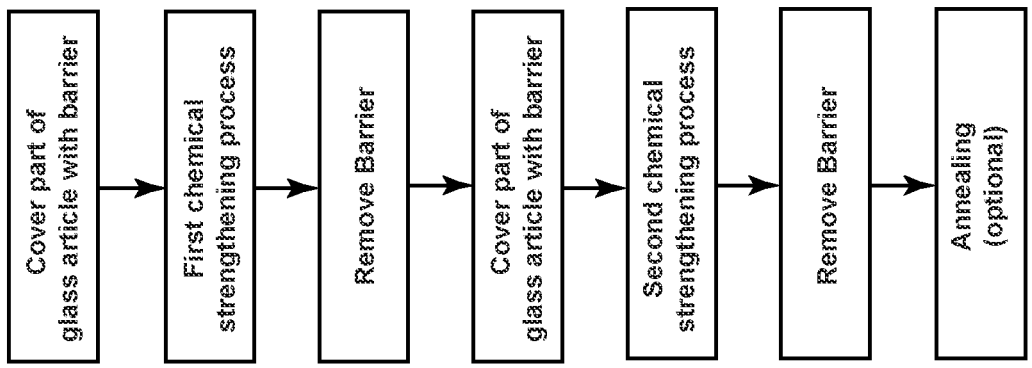
FIG. 6C
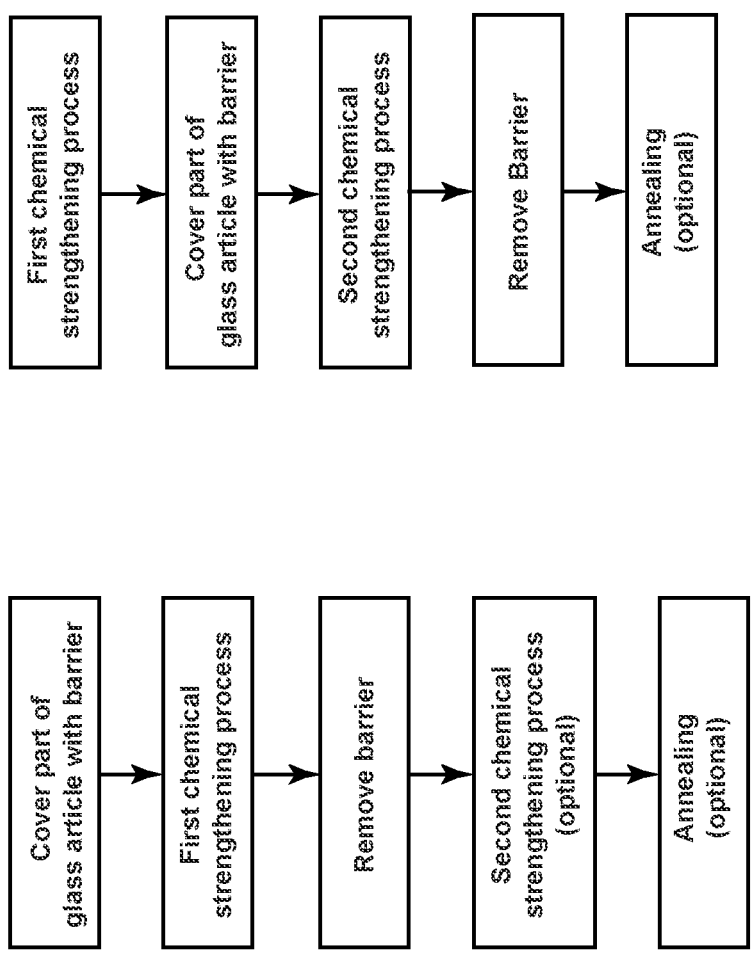
FIG. 6B
FIG. 6A

EDGE AND CORNER-STRENGTHENED ARTICLES AND METHODS FOR MAKING SAME

CROSS-REFERENCE TO RELATED APPLICATIONS

This application claims the benefit of priority under 35 U.S.C. § 371 of International Patent Application No. PCT/US16/28566, filed on Apr. 21, 2016, which claims the benefit of priority to U.S. Provisional Application Ser. No. 62/150,563 filed on Apr. 21, 2015, the contents of which are relied upon and incorporated herein by reference in their entireties.

BACKGROUND

The present disclosure generally relates to strengthened glass, glass-ceramic and ceramic articles having enhanced edge, side face and corner strength characteristics, and the methods for effecting such enhancements.

Currently, chemically-tempered and ion-exchanged glass, glass-ceramics, and ceramics are used in many electronic device components in order to improve the strength performance of these components under the application of external forces. For example, ion-exchanged glass is used as a substantially transparent display substrate in many mobile phone devices. In many of these applications, the edges and corners of the ion-exchanged articles can be vulnerable to these external forces due to localized tensile stress levels that exist in the articles after the strengthening process.

In some cases, the high tensile stress levels are observed near the corners and edges of the article, caused by growth of surface material from the ion-exchange strengthening process. The typical ion-exchange stress profile in a glass creates very high compressive stresses (CS) exceeding 500 MPa with appreciable compressive stress at depths of around 50 microns. In order to create such a high CS within the article, particularly in proximity to its primary surfaces, the surfaces of the article close to the edge corners must accommodate any surface material growth from the strengthening process. This can result in weaker edges and corners from the high, localized tensile stresses associated with the strengthening process. Empirically, the results of drop-testing of ion exchange-strengthened devices often demonstrate that greater than 50% of the failures are associated with cracks and defects at the corners and edges of the devices.

Consequently, there is a need for optimized methods and article configurations to accommodate the development of compressive stress regions within these articles without degrading the strength characteristics of the edges and corners of these articles.

SUMMARY

According to one embodiment of the disclosure, a strengthened article is provided that includes a glass, glass-ceramic or ceramic, having a plurality of primary surfaces, a plurality of side edges, and a thickness. The article also includes a compressive stress region extending from one of the primary surfaces to a first selected depth in the article; a central region extending from a boundary located at a depth of 200 µm from the primary surfaces and the edges to the centroid of the article; and an outer region extending between the primary surfaces and side edges to the boundary. Further, the maximum principal stress in tension within the outer region is no more than two times the maximum principal stress in tension within the central region. In certain aspects of the embodiment, the maximum compressive stress in the compressive stress region is about 400 MPa or less and the first selected depth is at least 8% of the thickness of the article. In some aspects of these strengthened articles, the primary surfaces and side edges define a plurality of corners, and the corners are defined by a chamfer, a fillet having an average radius of about 5% to 50% of the thickness, or a curved shape having at least one radius of curvature between about 5% and 100% of the thickness of the article.

According to another embodiment of the disclosure, a strengthened article is provided that includes a glass, glass-ceramic or ceramic having a plurality of primary surfaces, a plurality of side edges, and a thickness. The article also includes a primary compressive stress region extending from one of the primary surfaces to a first selected depth in the article; a central region extending from a boundary located at a depth of 200 µm from the primary surfaces and the edges to the centroid of the article; an outer region extending between the primary surfaces and side edges of the article to the boundary; and an edge compressive stress region extending from each of the side edges to a second selected depth in the article. The maximum compressive stress in the primary compressive stress region is about 700 MPa or less and the first selected depth is between about 1% and 10% of the thickness of the article. Further, the maximum principal stress in tension within the outer region is no more than two times the maximum principal stress in tension within the central region. In certain aspects of the embodiment, the maximum compressive stress in the edge compressive stress region is about 400 MPa or less, and 500 MPa or less in another aspect. In addition, the maximum compressive stress in the edge compressive stress region may be about 700 MPa or greater for other aspects of the embodiment.

In some aspects of the strengthened articles of the disclosure, the primary surfaces and side edges define a plurality of corners, and the corners are defined by a chamfer, a fillet having an average radius of about 5% to 50% of the thickness, or a curved shape having at least one radius of curvature between about 5% and 100% of the thickness of the article. In some cases, the primary surfaces and side edges define a plurality of corners, and the maximum tensile stress in substantial proximity to the side edges and corners that results from one or more processes for forming the compressive stress region or regions does not exceed 200 MPa. In certain embodiments, this maximum tensile stress does not exceed 100 MPa.

According to an additional embodiment of the disclosure, a device is provided that includes a housing having front, back, and side surfaces; electrical components that are at least partially inside the housing; a display at or adjacent to the front surface of the housing; and a cover substrate disposed over the display. Further, the cover substrate includes any of the foregoing strengthened articles.

According to a further embodiment, a method of making a strengthened article is provided that includes the step of: providing an article having a glass, glass-ceramic or ceramic composition with a plurality of ion-exchangeable alkali metal ions, the article further defined by a plurality of primary surfaces, a plurality of side edges, and a thickness. The method also includes the steps of: providing a first ion-exchange bath comprising a plurality of ion-exchanging alkali metal ions, each having a larger size than the size of the ion-exchangeable alkali metal ions; and submersing the article in the first ion-exchange bath at a first ion-exchange temperature and duration to form a compressive stress region extending from one of the primary surfaces to a first selected depth in the article. Further, the article further includes: (a) a central region extending from a boundary located at a depth of 200 µm from the primary surfaces and the edges to the centroid of the article, and (b) an outer region extending between the primary surfaces and side edges of the article to the boundary. In addition, the maximum principal stress in tension within the outer region is no more than two times the maximum principal stress in tension within the central region. In certain aspects of the method, the maximum compressive stress in the compressive stress region is about 400 MPa or less and the first selected depth is at least 8% of the thickness of the article.

According to an additional embodiment, a method of making a strengthened article is provided that includes the step of: providing an article having a glass, glass-ceramic or ceramic composition with a plurality of ion-exchangeable alkali metal ions, the article further defined by a plurality of primary surfaces, a plurality of side edges, and a thickness. The method also includes the steps of: providing a first ion-exchange bath comprising a plurality of ion-exchanging alkali metal ions, each having a larger size than the size of the ion-exchangeable alkali metal ions; masking each of the side edges of the article with an ion-exchange barrier material; submersing the masked article in the first ion-exchange bath at a first ion-exchange temperature and duration to form a primary compressive stress region extending from one of the primary surfaces to a first selected depth in the article; and removing the barrier material from the article. The article further includes: (a) a central region extending from a boundary located at a depth of 200 µm from the primary surfaces and the edges to the centroid of the article, and (b) an outer region extending between the primary surfaces and side edges of the article to the boundary. In addition, the maximum principal stress in tension within the outer region is no more than two times the maximum principal stress in tension within the central region. In certain aspects of this embodiment, the maximum compressive stress in the primary compressive stress region is about 800 MPa or more and the first selected depth is between about 1% and 10% of the thickness of the article.

According to another embodiment, a method of making a strengthened article is provided that includes the step of: providing an article having a glass, glass-ceramic or ceramic composition with a plurality of ion-exchangeable alkali metal ions, the article further defined by a plurality of primary surfaces, a plurality of side edges, and a thickness. The method also includes the steps of: providing a first ion-exchange bath comprising a plurality of ion-exchanging alkali metal ions, each having a larger size than the size of the ion-exchangeable alkali metal ions; and a second ion-exchange bath comprising a plurality of ion-exchanging alkali metal ions, each having a larger size than the size of the ion-exchangeable alkali metal ions. The method further includes the steps of: submersing the article in the first ion-exchange bath at a first ion-exchange temperature and duration to form an initial compressive stress region extending from one of the primary surfaces to a first selected depth in the article; masking each of the side edges of the article having the initial compressive stress region with an ion-exchange barrier material; submersing the masked article in the second ion-exchange bath at a second ion-exchange temperature and duration to form a primary compressive stress region extending from one of the primary surfaces to a second selected depth in the article; and removing the barrier material from the article. The article further includes: (a) a central region extending from a boundary located at a depth of 200 µm from the primary surfaces and the edges to the centroid of the article, and (b) an outer region extending between the primary surfaces and side edges of the article to the boundary. In addition, the maximum principal stress in tension within the outer region is no more than two times the maximum principal stress in tension within the central region. In certain aspects of this embodiment, the maximum compressive stress in the primary compressive stress region is about 700 MPa or more and the second selected depth is between about 1% and 10% of the thickness of the article.

According to a further embodiment, a method of making a strengthened article is provided that includes the step of: providing an article having a glass, glass-ceramic or ceramic composition with a plurality of ion-exchangeable alkali metal ions, the article further defined by a plurality of primary surfaces, a plurality of side edges, and a thickness. The method also includes the steps of: providing a first ion-exchange bath comprising a plurality of ion-exchanging alkali metal ions, each having a larger size than the size of the ion-exchangeable alkali metal ions; and a second ion-exchange bath comprising a plurality of ion-exchanging alkali metal ions, each having a larger size than the size of the ion-exchangeable alkali metal ions. The method further includes the steps: masking each of the side edges of the article with an ion-exchange barrier material; submersing the masked article in the first ion-exchange bath at a first ion-exchange temperature and duration to form a primary compressive stress region extending from one of the primary surfaces to a first selected depth in the article; and removing the barrier material from the article having the primary compressive stress region. The method also includes the steps: masking the primary surfaces of the article having the primary compressive stress region with an ion-exchange barrier material; submersing the article having the masked primary surfaces in the second ion-exchange bath at a second ion-exchange temperature and duration to form an edge compressive stress region extending from each of the side edges to a second selected depth in the article; and removing the barrier material from the article having the primary compressive stress region. The article further includes: (a) a central region extending from a boundary located at a depth of 200 µm from the primary surfaces and the edges to the centroid of the article, and (b) an outer region extending between the primary surfaces and side edges of the article to the boundary. In addition, the maximum principal stress in tension within the outer region is no more than two times the maximum principal stress in tension within the central region. In certain aspects of the embodiment, the maximum compressive stress in the primary compressive stress region is about 700 MPa or more and the first selected depth is at least 10% of the thickness of the article.

In certain aspects of these methods, the first and/or second ion exchange temperature can range from 460° C. to 520° C. and the ion exchange duration is controlled to be between about 30 minutes and about 5 hours. In other aspects of these methods, the first and/or second ion exchange temperature can range from 400° C. to 450° C. and the ion exchange duration is controlled to be between about 3 hours and about 15 hours. In certain aspects, the first and/or second ion exchange baths comprise about 100% by weight molten $KNO_3$. In further aspects, the first and/or second ion exchange baths can comprise about 97 to 99% by weight molten $KNO_3$, and about 1 to 3% by weight molten $KSO_4$.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments.

BRIEF DESCRIPTION OF THE DRAWINGS

FIG. 1 is a schematic, perspective view of strengthened articles according to an aspect of the disclosure;

FIG. 1A is a top-down, enlarged perspective view of a corner of one of the strengthened articles depicted in FIG. 1;

FIGS. 6A-6C are flow charts depicting three differential ion exchange processing sequences according to aspects of the disclosure.

DETAILED DESCRIPTION

Figure 1B:
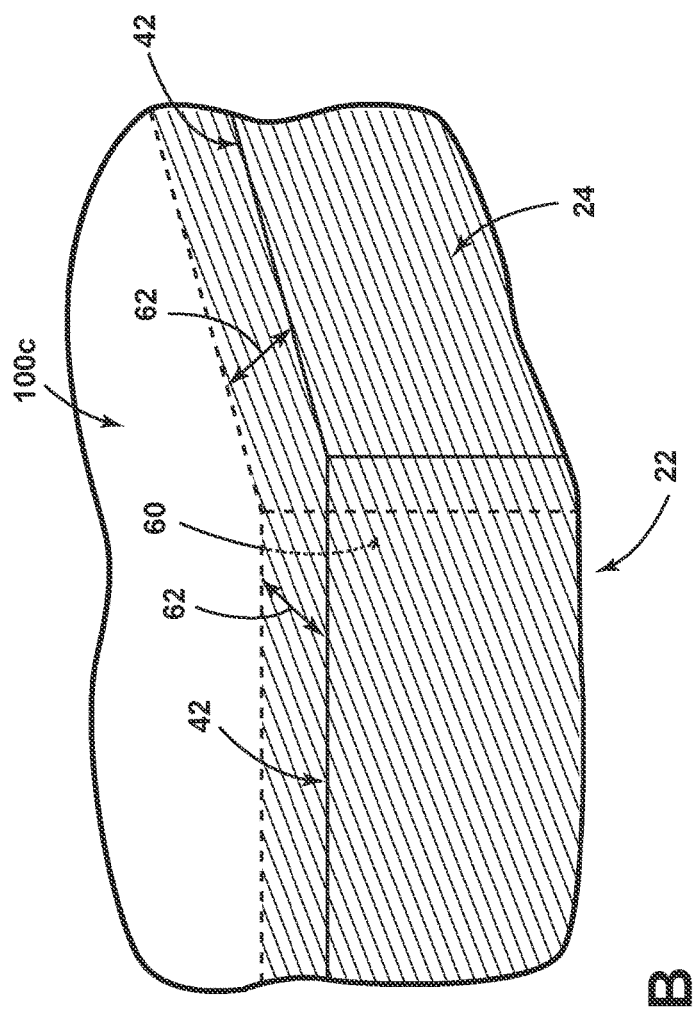
FIG. 1B is an enlarged, perspective view of an edge of one of the strengthened articles depicted in FIG. 1.

Reference will now be made in detail to the present preferred embodiments, examples of which are illustrated in the accompanying drawings. Whenever possible, the same reference numerals will be used throughout the drawings to refer to the same or like parts. It should be understood that the embodiments disclosed herein are merely examples, each incorporating certain benefits of the present invention.

Various modifications and alterations may be made to the following examples within the scope of the present invention, and aspects of the different examples may be mixed in different ways to achieve yet further examples. Accordingly, the true scope of the invention is to be understood from the entirety of the present disclosure, in view of but not limited to the embodiments described herein.

Terms such as "horizontal," "vertical," "front," "back," etc., and the use of Cartesian Coordinates are for the sake of reference in the drawings and for ease of description and are not intended to be strictly limiting either in the description or in the claims as to an absolute orientation and/or direction.

In general, the disclosure includes optimized methods and article configurations to both accommodate the development of one or more compressive stress regions within these articles, and enhance the strength characteristics of the edges, side faces and corners of these articles. For example, the disclosure details the benefits of developing a compressive stress region in the article with a relatively low compressive stress (CS) level and a high depth of compressive stress layer (DOL). This combination of low stress levels and high DOL can lead to less surface material growth and lower maximum principal stresses (in tension) in proximity to the edges and corners of the article. In some aspects, the corners and edges of the articles are further processed to comprise a chamfer, fillet, bezel or other curved shape, features which also reduce the maximum tensile stress levels in proximity to the edges and corners of the article.

The disclosure also outlines the benefits of developing multiple stress regions in the article through differential ion exchange processing conditions. In these aspects, the ion exchange process generally includes one or more ion exchange steps, some of which may be targeted to the edges and corners of the article through the masking of other regions of the article. The compressive stress regions that result from the differential ion exchange processes serve to reduce and minimize the maximum principal stresses in tension observed in proximity to the edges and corners of the article, thus improving their relative strength and the overall reliability of the article. In addition, these articles with enhanced-strength edges and corners can be characterized such that the maximum principal stress level (in tension) measured or estimated within their outer regions (e.g., within a depth of about 200 μm from their exterior surfaces) is no more than two times the maximum principal stress (in tension) measured within their central region (e.g., the region between the center of the article and a depth of about 200 μm from the exterior surfaces of the article).

As used herein, "compressive stress" (CS) and "depth of compressive stress layer" (DOL) are measured using means known in the art. For example, CS and DOL are measured by a surface stress meter using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to a modified version of Procedure C described in ASTM standard C770-98 (2013), entitled "Standard Test Method for Measurement of Glass Stress-Optical Coefficient," the contents of which are incorporated herein by reference in their entirety. The modification includes using a glass disc as the specimen with a thickness of 5 to 10 mm and a diameter of 12.7 mm. Further, the glass disc is isotropic, homogeneous and core-drilled with both faces polished and parallel. The modification also includes calculating the maximum force, $F_{max}$, to be applied. The force should be sufficient to produce at least 20 MPa compressive stress. The maximum force to be applied, $F_{max}$, is calculated as follows according to Equation (1):

$$F_{max} = 7.854 * D * h \quad (1)$$

where $F_{max}$ is the maximum force in Newtons, D is the diameter of the glass disc, and h is the thickness of the light path. For each force applied, the stress is computed according to Equation (2):

$$\sigma = \frac{8 * F_{max}}{\pi * D * h} \quad (2)$$

where $F_{max}$ is the maximum force in Newtons obtained from Equation (1), D is the diameter of the glass disc, and h is the thickness of the light path.

As used herein, the "depth of compressive stress layer (DOL)" refers to a depth location within the strengthened article where the compressive stress generated from the strengthening process reaches zero.

Referring to FIG. 1, a strengthened article 100 is provided that includes an article 90 having a glass, glass-ceramic or ceramic composition, and a plurality of primary surfaces 12 and 14. The article also includes side faces 22 and 24, edges 42 and 44, corners 32 and 34, and a thickness 54. The article 90 further includes a compressive stress region 50 extending from one of the primary surfaces 12, 14 to a first selected depth 52 in the article. As depicted in FIG. 1, the compressive stress region 50 extends from the primary surface 12 to the first selected depth 52. In certain aspects, the compressive stress region 50 will extend from the primary surface 14 to a first depth 52. Moreover, some aspects of the strengthened article 100 will contain two primary compressive stress regions 50, each region 50 extending from a respective primary surface to a first selected depth and the selected depths for these regions may or may not be the same depending on the particular configuration for the article 100.

In certain implementations, the maximum compressive stress in the region 50 of the article 90 employed in the strengthened article 100 is about 400 MPa or less and the first selected depth 52 is at least 8% of the thickness of the article. Relative to conventional strengthened articles within the field of this disclosure (e.g., an article having a compressive stress region with about 900 MPa in compressive stress and a DOL of about 45-50 μm for a 0.8 mm thick substrate), the article 90 having such a compressive stress region 50 exhibits relatively low levels of compressive stress (CS) and relatively high depth of compression levels. In certain aspects, the depth of compressive stress layer (DOL) is over 10% of the thickness of the article (e.g., about 70-80 μm for a 0.7 to 0.8 mm thick substrate) and, in some cases, can exceed 20% of the thickness of the article (e.g., about 150-160 μm for a 0.7 to 0.8 mm thick substrate).

These strengthened articles 100 containing such compressive stress region 50 characteristics possess reduced maximum tensile stresses in proximity to the edges and corners of the article, thus enhancing the strength of the corners and edges of the article. With these edge and corner strength enhancements, the overall reliability of a device containing the article can be improved. In certain aspects, the maximum tensile stresses in proximity to the edges and corners of the article do not exceed 200 MPa. According to certain aspects of the disclosure, the strengthened articles can exhibit a maximum tensile stress in substantial proximity to the edges and corners of the glass that do not exceed 100 MPa.

Figure 1C:
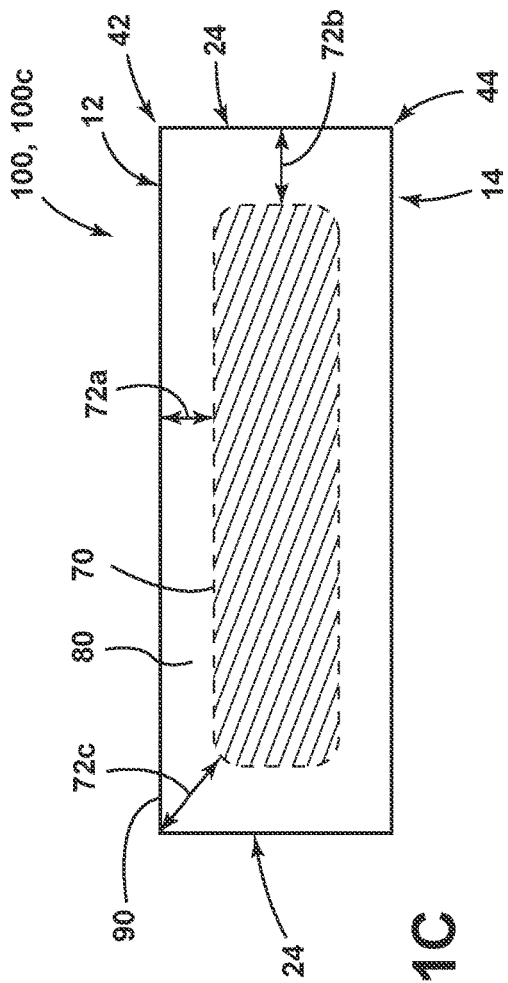
FIG. 1C is a cross-sectional view of the strengthened articles depicted in FIG. 1.

As also shown in FIGS. 1 and 1C, the strengthened articles 100 can include a central region 70 in the article 90 extending from a boundary located at a depth 72 from the primary surfaces 12, 14 and the edges 42, 44 to the centroid of the article (not shown). In certain implementations of the strengthened articles 100, the depth 72 is defined at about 200 μm. In addition, the central region 70 can also be defined such that it is located at a depth 72a from primary surfaces 12, 14, a depth 72b from side faces 24 and/or a depth 72c from corners 42, 44 (see FIG. 1C). Accordingly, the depth 72 may not be constant throughout the volume of the article 90. It should also be understood that the centroid of the article 90 is the approximate geometric center of the volume defined by the interior of the article 90. As also depicted in FIG. 1, the article 90 can include an outer region 80 that extends between the primary surfaces 12, 14 and side edges 42, 44 of the article 90 to the boundary of the central region 70 defined by the depth 72. Under these constructs, the maximum principal stress in tension within the outer region 80 is no more than two times the maximum principal stress in tension within the central region 70. Conventionally strengthened articles, in contrast, often exhibit maximum principal stresses in proximity to their corners and edges that well exceed two times the maximum principal stress in central region of the article. In other words, the strength-enhancing aspects of the strengthened article 100 serves to reduce the maximum principal stress (in tension) within the outer region 80 such that it is only two times or less than the maximum principal stress in the central region 70 of the article. For example, the maximum principal stress in the outer region 80 will be 160 MPa or less if the central region 70 exhibits a maximum principal stress in tension of 80 MPa. These significant reductions in principal stresses in proximity to the edges 42, 44 of the article (and the corners 32, 34) enhance the overall reliability of the article 90.

The article 90 employed in the strengthened article 100 can comprise various glass compositions, glass-ceramic compositions and ceramic compositions. The choice of glass is not limited to a particular glass composition. For example, the composition chosen can be any of a wide range of silicate, borosilicate, aluminosilicate, or boroaluminosilicate glass compositions, which optionally can comprise one or more alkali and/or alkaline earth modifiers.

By way of illustration, one family of compositions that may be employed in the article 90 includes those having at least one of aluminum oxide or boron oxide and at least one of an alkali metal oxide or an alkaline earth metal oxide, wherein $-15$ mol $\% \leq (R_2O + R'O - Al_2O_3 - ZrO_2) - B_2O_3 \leq 4$ mol %, where R can be Li, Na, K, Rb, and/or Cs, and R' can be Mg, Ca, Sr, and/or Ba. One subset of this family of compositions includes from about 62 mol % to about 70 mol % $SiO_2$; from 0 mol % to about 18 mol % $Al_2O_3$; from 0 mol % to about 10 mol % $B_2O_3$; from 0 mol % to about 15 mol % $Li_2O$; from 0 mol % to about 20 mol % $Na_2O$; from 0 mol % to about 18 mol % $K_2O$; from 0 mol % to about 17 mol % MgO; from 0 mol % to about 18 mol % CaO; and from 0 mol % to about 5 mol % $ZrO_2$. Such glasses are described more fully in U.S. Pat. Nos. 8,969,226 and 8,652,978, hereby incorporated by reference in their entirety as if fully set forth below.

Another illustrative family of compositions that may be employed in the article 90 includes those having at least 50 mol % $SiO_2$ and at least one modifier selected from the group consisting of alkali metal oxides and alkaline earth metal oxides, wherein $[(Al_2O_3 \text{ (mol %)}+B_2O_3 \text{ (mol %)})/(\Sigma \text{ alkali metal modifiers (mol %)})]>1$. One subset of this family includes from 50 mol % to about 72 mol % $SiO_2$; from about 9 mol % to about 17 mol % $Al_2O_3$; from about 2 mol % to about 12 mol % $B_2O_3$; from about 8 mol % to about 16 mol % $Na_2O$; and from 0 mol % to about 4 mol % $K_2O$. Such glasses are described in more fully in U.S. Pat. No. 8,586,492, hereby incorporated by reference in its entirety as if fully set forth below.

Yet another illustrative family of compositions that may be employed in the article 90 includes those having $SiO_2$, $Al_2O_3$, $P_2O_5$, and at least one alkali metal oxide ($R_2O$), wherein $0.75 \leq [(P_2O_5 \text{ (mol %)}+R_2O \text{ (mol %)})/M_2O_3 \text{ (mol %)}] \leq 1.2$, where $M_2O_3 = Al_2O_3 + B_2O_3$. One subset of this family of compositions includes from about 40 mol % to about 70 mol % $SiO_2$; from 0 mol % to about 28 mol % $B_2O_3$; from 0 mol % to about 28 mol % $Al_2O_3$; from about 1 mol % to about 14 mol % $P_2O_5$; and from about 12 mol % to about 16 mol % $R_2O$. Another subset of this family of compositions includes from about 40 to about 64 mol % $SiO_2$; from 0 mol % to about 8 mol % $B_2O_3$; from about 16 mol % to about 28 mol % $Al_2O_3$; from about 2 mol % to about 12 mol % $P_2O_5$; and from about 12 mol % to about 16 mol % $R_2O$. Such glasses are described more fully in U.S. patent application Ser. No. 13/305,271, hereby incorporated by reference in its entirety as if fully set forth below.

Yet another illustrative family of compositions that can be employed in the article 90 includes those having at least about 4 mol % $P_2O_5$, wherein $(M_2O_3 \text{ (mol %)}/R_xO \text{ (mol %)})<1$, wherein $M_2O_3=Al_2O_3+B_2O_3$, and wherein $R_xO$ is the sum of monovalent and divalent cation oxides present in the glass. The monovalent and divalent cation oxides can be selected from the group consisting of $Li_2O$, $Na_2O$, $K_2O$, $Rb_2O$, $Cs_2O$, MgO, CaO, SrO, BaO, and ZnO. One subset of this family of compositions includes glasses having 0 mol % $B_2O_3$. Such glasses are more fully described in U.S. patent application Ser. No. 13/678,013 and U.S. Pat. No. 8,765,262, the contents of which are hereby incorporated by reference in their entirety as if fully set forth below.

Still another illustrative family of compositions that can be employed in the article 90 includes those having $Al_2O_3$, $B_2O_3$, alkali metal oxides, and contains boron cations having three-fold coordination. When ion exchanged, these glasses can have a Vickers crack initiation threshold of at least about 30 kilograms force (kgf). One subset of this family of compositions includes at least about 50 mol % $SiO_2$; at least about 10 mol % $R_2O$, wherein $R_2O$ comprises $Na_2O$; $Al_2O_3$, wherein $-0.5 \text{ mol %} \leq Al_2O_3 \text{ (mol %)} - R_2O \text{ (mol %)} \leq 2 \text{ mol %}$; and $B_2O_3$, and wherein $B_2O_3 \text{ (mol %)} - (R_2O \text{ (mol %)} - Al_2O_3 \text{ (mol %)}) \geq 4.5 \text{ mol %}$. Another subset of this family of compositions includes at least about 50 mol % $SiO_2$, from about 9 mol % to about 22 mol % $Al_2O_3$; from about 4.5 mol % to about 10 mol % $B_2O_3$; from about 10 mol % to about 20 mol % $Na_2O$; from 0 mol % to about 5 mol % $K_2O$; at least about 0.1 mol % MgO and/or ZnO, wherein $0 \leq MgO+ZnO \leq 6 \text{ mol %}$; and, optionally, at least one of CaO, BaO, and SrO, wherein $0 \text{ mol %} \leq CaO+SrO+BaO \leq 2 \text{ mol %}$. Such glasses are more fully described in U.S. patent application Ser. No. 13/903,398, the content of which is incorporated herein by reference in its entirety as if fully set forth below.

Unless otherwise noted, the edge- and corner-strengthened articles and associated methods for producing them outlined in this disclosure are exemplified by an article having an alumino-silicate glass composition of 68.96 mol % $SiO_2$, 0 mol % $B_2O_3$, 10.28 mol % $Al_2O_3$, 15.21 mol % $Na_2O$, 0.012 mol % $K_2O$, 5.37 mol % MgO, 0.0007 mol % $Fe_2O_3$, 0.006 mol % $ZrO_2$, and 0.17 mol % $SnO_2$. A typical aluminosilicate glass is described in U.S. patent application Ser. No. 13/533,298, and hereby incorporated by reference.

Similarly, with respect to ceramics, the material chosen for the article 90 employed in the strengthened article 100 can be any of a wide range of inorganic crystalline oxides, nitrides, carbides, oxynitrides, carbonitrides, and/or the like. Illustrative ceramics include those materials having an alumina, aluminum titanate, mullite, cordierite, zircon, spinel, persovskite, zirconia, ceria, silicon carbide, silicon nitride, silicon aluminum oxynitride, or zeolite phase.

Similarly, with respect to glass-ceramics, the material chosen for the article 90 can be any of a wide range of materials having both a glassy phase and a ceramic phase. Illustrative glass-ceramics include those materials where the glass phase is formed from a silicate, borosilicate, aluminosilicate, or boroaluminosilicate, and the ceramic phase is formed from β-spodumene, β-quartz, nepheline, kalsilite, or carnegieite.

The article 90 employed within the strengthened article 100 can adopt a variety of physical forms, including a glass substrate. That is, from a cross-sectional perspective, the article 90, when configured as a substrate, can be flat or planar, or it can be curved and/or sharply-bent. Similarly, the article 90 can be a single unitary object, a multi-layered structure, or a laminate. When the article 90 is employed in a substrate or plate-like form, the thickness (e.g., thickness 54) is preferably in the range of about 0.2 to 1.5 mm, and more preferably in the range of about 0.8 to 1 mm. Further, the article 90 can possess a composition that is substantially transparent in the visible spectrum, and which remains substantially transparent after the development of its compressive stress region 50.

Regardless of its composition or physical form, the article 90, as employed in the strengthened article 100, will include a region 50 under compressive stress that extends inward from a surface (e.g., primary surfaces 12, 14) of the substrate to a specific depth therein (i.e., the "first depth"). This compressive stress region can be formed from a strengthening process (e.g., by thermal tempering, chemical ion-exchange, or like processes). The amount of compressive stress (CS) and the depth of compressive stress layer (DOL) associated with the compressive stress region 50 can be varied based on the particular use for the article 100. One general limitation, particularly for an article 90 having a glass composition, is that the CS and DOL should be limited such that a tensile stress created within the bulk of the article 90 as a result of the compressive stress region 50 does not become so excessive as to render the article frangible.

In certain aspects of the disclosure, compressive stress (CS) profiles of articles 90 having a glass composition that were strengthened using an ion exchange process were determined using a method for measuring the stress profile based on the TM and TE guided mode spectra of the optical waveguide formed in the ion-exchanged glass (hereinafter referred to as the "WKB method"). The method includes digitally defining positions of intensity extrema from the TM and TE guided mode spectra, and calculating respective TM and TE effective refractive indices from these positions. TM and TE refractive index profiles $n_{TM}(z)$ and $n_{TE}(z)$ are calculated using an inverse WKB calculation. The method also includes calculating the stress profile $S(z)=[n_{TM}(z)-n_{TE}(z)]/SOC$, where SOC is a stress optic coefficient for the glass substrate. This method is described in U.S. patent application Ser. No. 13/463,322 by Douglas C. Allan et al., entitled "Systems and Methods for Measuring the Stress Profile of Ion-Exchanged Glass," filed May 3, 2012, and claiming priority to U.S. Provisional Patent Application No. 61/489,800, filed May 25, 2011, the contents of which are incorporated herein by reference in their entirety. Other techniques for measuring stress levels in these articles as a function of depth are outlined in U.S. Provisional Application Nos. 61/835,823 and 61/860,560, hereby incorporated by reference.

Referring again to FIG. 1, a method for developing the compressive stress region 50 in the strengthened article 100 involves submersing the article 90 in a strengthening bath. In some aspects, the bath contains a plurality of ion-exchanging metal ions and the article 90 has a glass composition with a plurality of ion-exchangeable metal ions. For example, the bath may contain a plurality of potassium ions that are larger in size than ion-exchangeable ions in the article 90, such as sodium. The ion-exchanging ions in the bath will preferentially exchange with the ion-exchangeable ions in the article 90.

In certain aspects, the strengthening bath employed to create the compressive stress region 50 comprises a molten $KNO_3$ bath at a concentration approaching 100% by weight with additives as understood by those with ordinary skill in the field, or at a concentration of 100% by weight. Such a bath is sufficiently heated to a temperature to ensure that the $KNO_3$ remains in a molten state during processing of the article 90. The strengthening bath may also include a combination of $KNO_3$ and one or both of $LiNO_3$ and $NaNO_3$.

According to some aspects of the disclosure, a method for developing a compressive stress region 50 with a maximum compressive stress of about 400 MPa or less and a first selected depth 52 of at least 8% of the thickness of the article in an article 90 having a alumino-silicate glass composition involves submersing the article 90 in a strengthening bath held at a temperature in a range from about 400° C. to 500° C. with a submersion duration between about 3 and 60 hours. More preferably, the compressive stress region 50 can be developed by submersing the article 90 in a strengthening bath at a temperature ranging from about 420° C. to 500° C. for a duration between about 0.25 to about 50 hours. In certain aspects, an upper temperature range for the strengthening bath is set to be about 30° C. less than the anneal point of the glass (e.g., when article 90 possesses a glass composition). Particularly preferable durations for the submersion step range from 0.5 to 25 hours. In certain embodiments, the strengthening bath is held at about 400° C. to 450° C., and the first ion exchange duration is between about 3 and 15 hours.

In one exemplary aspect, the article 90 is submersed in a strengthening bath at 450° C. that includes about 41% $NaNO_3$ and 59% $KNO_3$ by weight for a duration of about 10 hours to obtain a compressive stress region 50 with a DOL >80 µm and a maximum compressive stress of 300 MPa or less (e.g., for an article 90 having at thickness about 0.8 to 1 mm) In another example, the strengthening bath includes about 65% $NaNO_3$ and 35% $KNO_3$ by weight, is held at 460° C., and the submersion step is conducted for about 40 to 50 hours to develop a compressive stress region 50 with a maximum compressive stress of about 160 MPa or less with a DOL of about 150 µm or more (e.g., for an article 90 having at thickness of about 0.8 mm).

According to a further aspect, a range of preferable conditions for the ion exchange bath and submersion step to develop a compressive stress region 50 in the article 90 with an alumino-silicate glass composition and thickness between about 0.8 to 1 mm that minimizes tensile stresses in proximity to its edges and corners includes: a bath with about 40-55% $NaNO_3$ and 60-45% $KNO_3$, respectively, held at a temperature between about 440° C. to 470° C. Preferably, the bath temperature is set between 450° C. and 460° C. and the duration of the submersion is about 8-10 hours. For applications of the strengthened article 100 containing higher DOL levels, higher $NaNO_3$ levels in the bath should preferably be employed with longer immersion durations. For example, the following poisoning levels and immersion durations can be employed to generate DOLs of 120±25 µm, 170±25 µm, and 220±25 µm: 45-55% $NaNO_3$, 52-62% $NaNO_3$, and 58-68% $NaNO_3$ and immersion durations of 12-50 hours, 40-100 hours, and 80-200 hours, respectively. DOL values greater than about 180 µm would preferably be obtained with a glass article 90 having a thickness above 0.9 mm, e.g., about 0.9 mm to 1.3 mm, in order to avoid excessive ion exchange durations. Similarly, DOL values above 200 µm should preferably be obtained for glass articles 90 having a thickness above 1 mm, e.g., about 1 mm to 1.3 mm, to avoid excessively long ion exchange durations. The higher concentrations of $NaNO_3$ are preferred when higher DOLs are targeted. For example, higher DOLs in the glass article are useful in some aspects to avoid the condition of frangibility, i.e., a safety concern associated with breakage of the glass article into a large number of small pieces upon a fracture-inducing condition.

For alumino-silicate glass articles 90 having a thickness of about 0.3 to 0.8 mm, a DOL >60 µm can be achieved with a strengthening bath composition in the range of 40 to 60% $NaNO_3$ by weight (with a balance being $KNO_3$) held at a temperature of 450° C. with a submersion duration between about 5.5 to 15 hours. Preferably, the submersion duration is between about 6 to 10 hours and the strengthening bath is held at a composition in the range of 44 to 54% $NaNO_3$ by weight (with a balance $KNO_3$).

For embodiments of the article 90 containing alumino-silicate glass with appreciable amounts of $P_2O_5$, the strengthening bath can be held at somewhat lower temperatures to develop a similar compressive stress region 50. For example, the strengthening bath can be held as low as 380° C. with similar results, while the upper range outlined in the foregoing remains viable. In a further aspect, the article 90 may possess a lithium-containing glass composition and appreciably lower temperature profiles can be employed to generate a similar compressive stress region 50. In these aspects, the strengthening bath is held at a temperature ranging from about 350° C. to about 500° C., and preferably from about 380° C. to about 480° C. The submersion times for these aspects range from about 0.25 hours to about 50 hours and, more preferably, from about 0.5 to about 25 hours.

Figure 2:
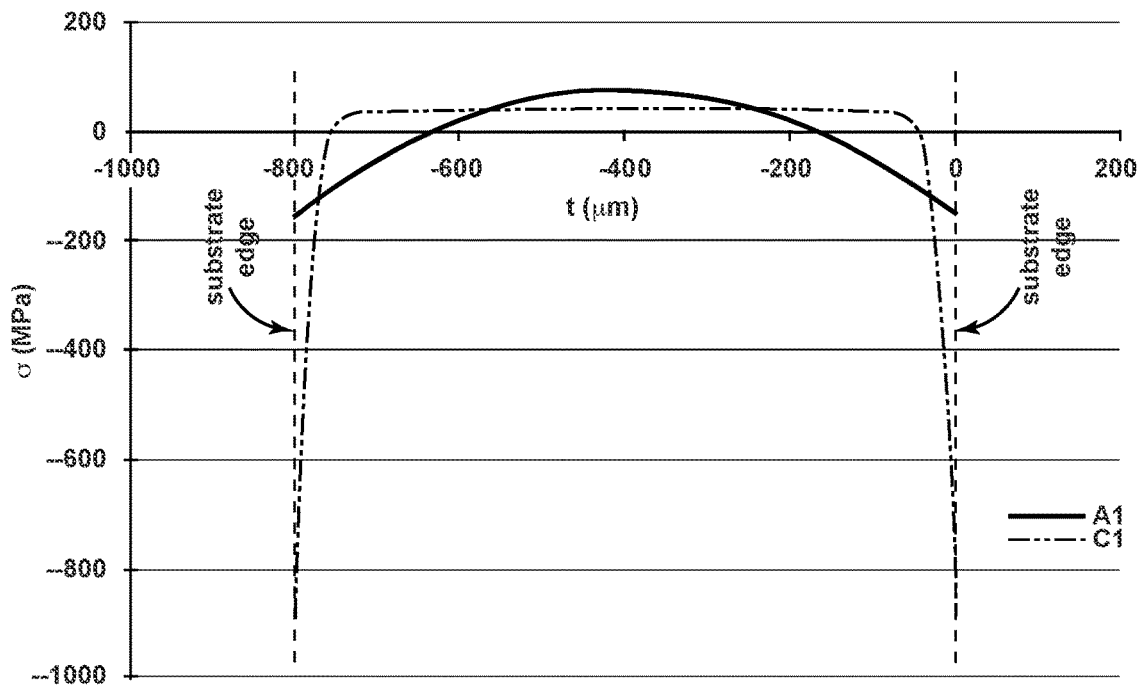
FIG. 2 is a schematic of the stress through the thickness of two strengthened articles according to a further aspect of the disclosure.

Referring to FIG. 2, a schematic, simulated profile of the stress through the thickness of two strengthened articles is provided. The profile designated "A1" corresponds to a strengthened glass article according to an aspect of the disclosure comprising an article 90 having a glass composition with a compressive stress region 50 developed by ion-exchange submersion in a strengthening bath having about 65% $NaNO_3$ and about 35% $KNO_3$ (by weight) at 460° C. for a duration of about 40 to 50 hours. The A1 profile demonstrates a maximum compressive stress of about 160 MPa and a DOL of about 160 µm. In contrast, the profile designated "C1" corresponds to a conventionally strengthened glass article with a high CS level and a low DOL, ion-exchange processed to a compressive stress level of 900 MPa with a DOL of about 50 µm.

Figure 3A:
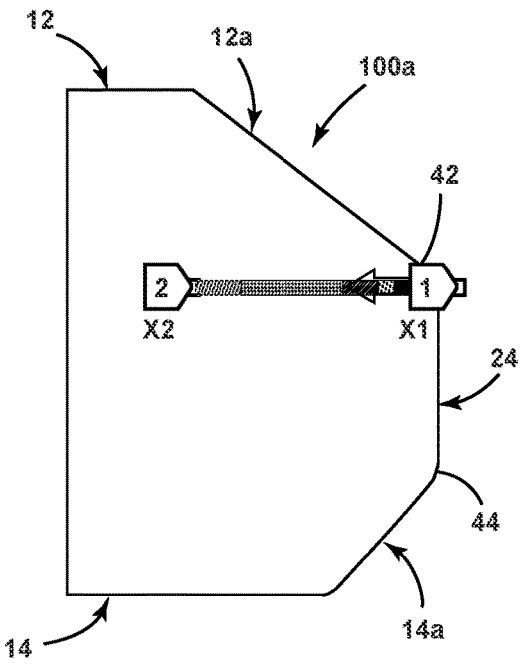
FIG. 3A is a cross-sectional view of a strengthened article having edges that define a chamfer according to an aspect of the disclosure.

The strengthened article exhibiting the A1 profile depicted in FIG. 2 has significantly reduced maximum tensile stress levels in substantial proximity to its corners and edges in comparison to the article possessing the C1 profile. This effect is demonstrated by FIGS. 3A and 4. Referring to FIG. 3A, a cross-sectional view of a strengthened article 100a having the A1 stress profile (see FIG. 2) is depicted. As shown, strengthened article 100a includes primary surfaces 12, 14, faceted surfaces 12a, 14a and side faces 24. Edges 42 and 44 are defined between the side face 24 and the faceted surfaces 12a, 14a, respectively. As such, the side faces 24, primary surfaces 12, 14, and/or faceted surfaces 12a, 14a can effectively define a chamfer at one or more of the corners (not shown) of the article 100a. These chamfered corners can serve to provide some reduction of the maximum principal stress (in tension) in proximity to the corners, edges 42, 44 and side faces 24 by reducing geometric-related stress concentration levels.

Figure 4:
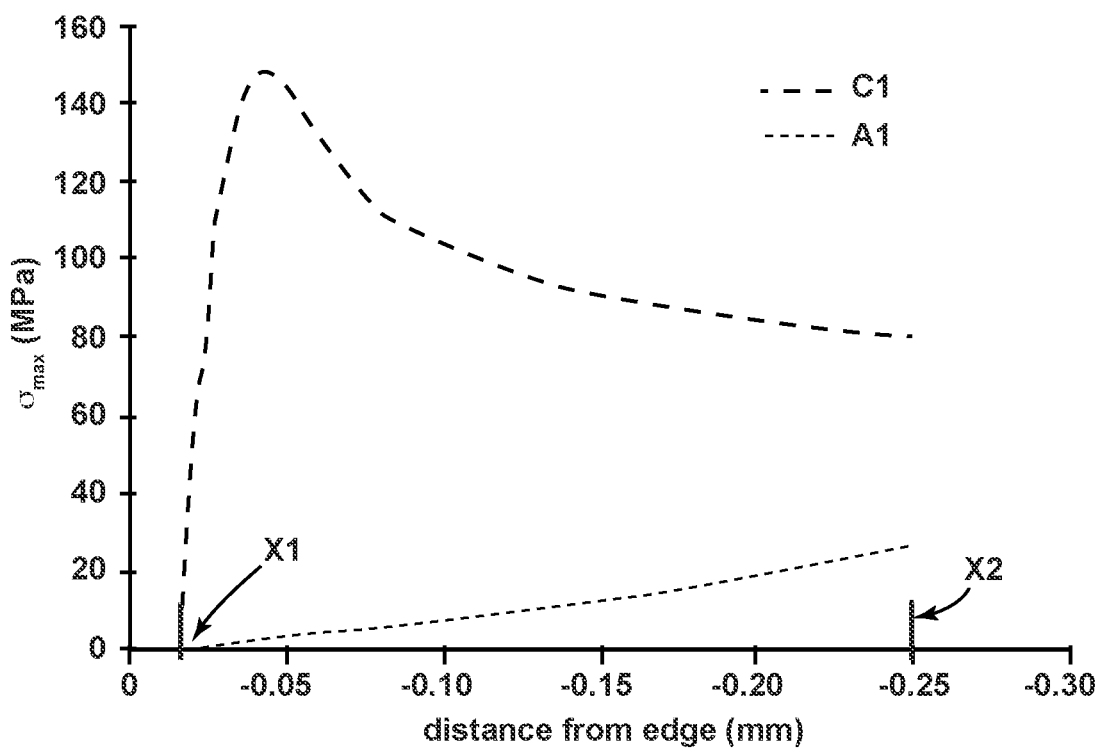
FIG. 4 is a schematic plot of the maximum tensile stress observed between the X1 and X2 points within the article depicted in FIG. 3A, as subjected to two differing ion exchange processing conditions according to an aspect of the disclosure.

In FIG. 3A, the points "X1" and "X2" define a path from the side face 24 of the article into the bulk of the article. Referring to FIG. 4, a schematic plot of the maximum tensile stress (MPa) is observed between the X1 and X2 points for the articles possessing the A1 and C1 profiles (see FIG. 2). As shown in FIG. 4, the maximum tensile stress in the X1 to X2 path is significantly reduced in the articles having the A1 profile compared to the article having the C1 profile (i.e., about 30 MPa vs. about 150 MPa).

In some aspects of the strengthened articles 100 and 100a (see FIGS. 1 and 3A), the edges and corners (e.g., edges 42, 44 and corners 32, 34) can be defined by a fillet (e.g., rounded to a particular radius), or another curved shape having more than one radius of curvature. In some implementations, the fillet or fillets employed in the strengthened article 100b will have a radius of about 5% to about 50% of the thickness of the article (see, e.g., the thickness 54 of the article 90 depicted in FIG. 1). In other implementations, the curved shape or shapes employed in the strengthened article 100b will possess multiple radii of curvature, with each radius between about 5% and about 100% of the thickness of the article.

Figure 3B:
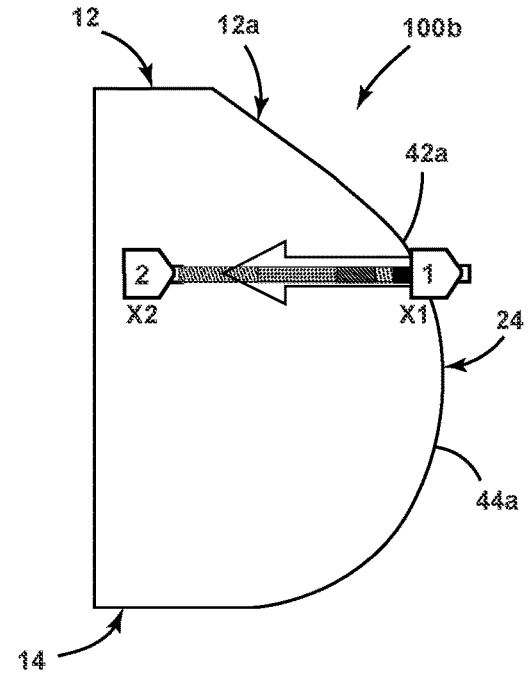
FIG. 3B is a cross-sectional view of a strengthened article having edges that define a chamfer and a fillet according to a further aspect of the disclosure.

Referring to FIG. 3B, a strengthened article 100b is depicted with edges 42a, 44a having a rounded contour (e.g., a fillet). In addition, the strengthened article 100b depicted in FIG. 3B includes a faceted surface 12a defined between the primary surface 12 and edge 42a. Accordingly, the strengthened article 100b depicted in FIG. 3B is configured to exhibit lower maximum tensile stresses in proximity to these edges compared to strengthened articles lacking such geometric features (e.g., strengthened articles having sharp corners and edges).

Figure 5:
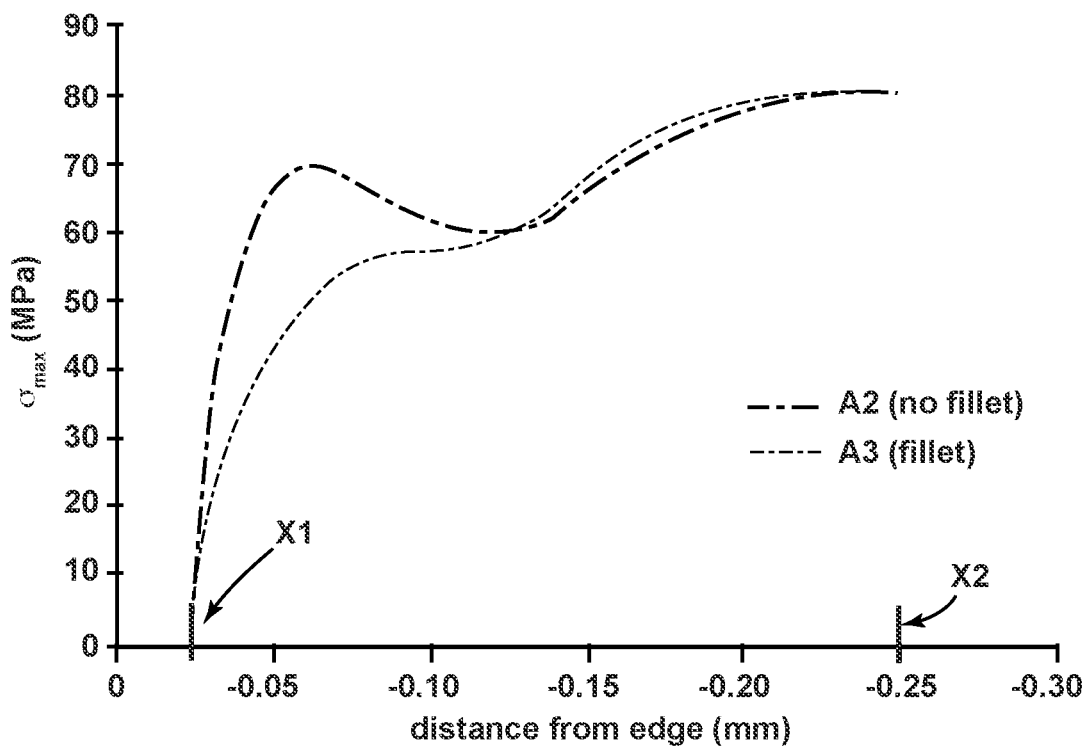
FIG. 5 is a schematic plot of the maximum tensile stress observed between the X1 and X2 points within the articles depicted in FIGS. 3A and 3B.

Referring again to FIG. 3B, the points "X1" and "X2" define a path from the side face 24 of the strengthened article 100b into the bulk of the article. Maximum stress levels can be estimated between the points X1 and X2 the article 100b depicted in FIG. 3B with a fillet in addition to a chamfered surface in comparison to strengthened articles lacking such geometric features. In FIG. 5, the maximum tensile stress (MPa) is estimated between the X1 and X2 points for the article 100b with a fillet depicted in FIG. 3B, designated "A3" in the figure. In the same figure, the maximum tensile stress (MPa) is estimated for articles with faceted surfaces having sharper edges and corners (e.g., comparable to an article 100 depicted in FIG. 3A), designated "A2" in the figure. Note that the articles A2 and A3 employed to develop the simulated stress profile depicted in FIG. 5 were assumed to possess the same compressive stress region 50, developed according to an ion-exchange process with a compressive stress level of about 900 MPa and a DOL of about 75 µm.

As shown in FIG. 5, the maximum tensile stress profile in the X1 to X2 path for the A3 sample demonstrates an overall reduction in the maximum principal stress (in tension) of strengthened articles having edges and corners with a fillet compared to the strengthened article A2 possessing a set of corners and edges without a fillet. It should also be understood that such an effect is expected for articles having compressive stress regions that differ from the compressive stress region employed to develop the estimated data depicted in FIG. 5. Accordingly, edges and corners exhibiting a chamfer, fillet or another curved shape can be employed in the strengthened articles of the disclosure to further augment the benefits of the compressive stress region 50. In certain aspects, strengthened articles 100 employing compressive stress regions 50 with higher surface compressive stress levels (e.g., those compressive stress and DOL levels that could lead to material growth in proximity to the edges and corners) can be prepared with a chamfer, fillet or another curved shape to offset the tensile stress levels in proximity to these edges and corners that would otherwise develop associated with surface material growth.

Figure 3C:
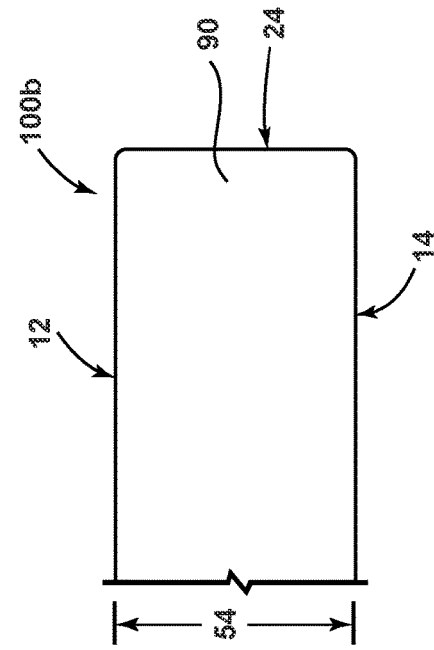
FIG. 3C is a cross-sectional view of a strengthened article having edges that define a fillet according to an additional aspect of the disclosure.
Figure 3D:
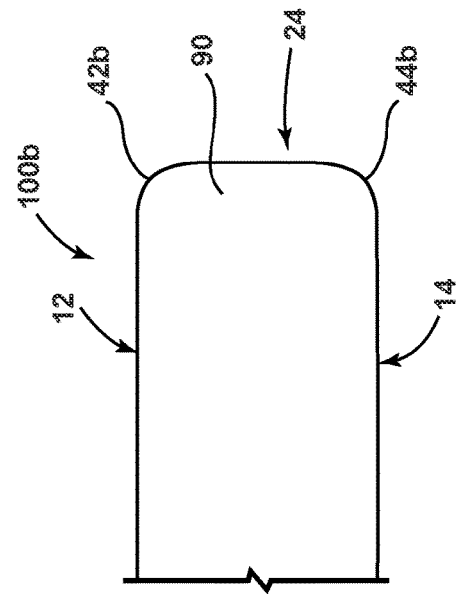
FIG. 3D is a cross-sectional view of a strengthened article having edges that define a fillet with a radius of about 5% of the thickness of the article according to an aspect of the disclosure.
Figure 3E:
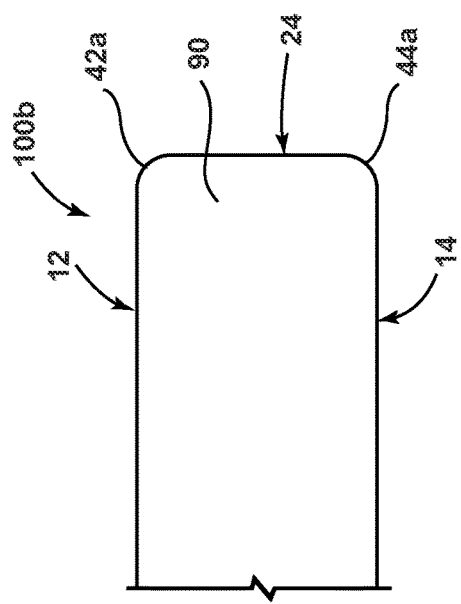
FIG. 3E is a cross-sectional view of a strengthened article having edges that define a fillet with a radius of about 50% of the thickness of the article according to an aspect of the disclosure.

As shown in FIGS. 3C-3E, various implementations of strengthened articles 100b possessing edges and/or corners with one or more fillets are depicted. In FIG. 3C, edges 42a and 44a exhibit a fillet with an intermediate radius of curvature (e.g., between 5% and 50% of the thickness 54 of the article 90). In FIGS. 3D and 3E, the edges 42a and 44a possess a fillet with a radius of curvature of about 5% and about 50%, respectively, of the thickness 54 of the article 90. These depictions of the strengthened article 100b with edges 42a and 44a having a fillet are exemplary. Depending upon the shape the article 90, including the number of its side faces, edges and corners, one or more fillets can be employed to reduce the maximum principal stress in tension in proximity to these features. It should also be understood that strengthened articles 100b containing two or more fillets can be configured such that each of these fillets have the same or different radii, again depending on the shape of the article 90 and desired tensile stress reductions in proximity to the fillet.

Figure 3F:
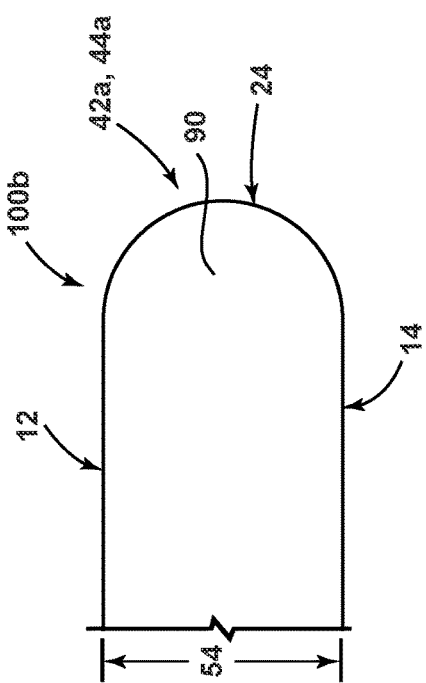
FIG. 3F is a cross-sectional view of a strengthened article having edges that define a curved shape with a varying radius according to a further aspect of the disclosure.

Referring to FIG. 3F, a strengthened article is depicted with edges 42b, 44b possessing a curved shape with more than one radius of curvature. In certain implementations of such strengthened articles 100b, the shape of the edges 42b, 44b can be fit to a mathematical spline function; consequently, the edges 42b, 44b can possess a spline-like shape. More generally, the edges 42b, 44b can possess two or more radius of curvature values, each between about 5% and about 100% of the thickness of the article 90. As shown in FIG. 3F, for example, it is apparent that transition regions in close proximity to the primary surfaces 12, 14 have a large radius of curvature approaching the thickness of the article. It should also be understood that the shape the article 90, including the number of its side faces, edges and corners, can be a factor in configuring the strengthened article 100b with edges and/or corners having curved shapes and contours with two or more radius of curvature values to reduce the maximum principal stress in tension in proximity to these features. It should also be understood that strengthened articles 100b containing two or more such curved shapes can be configured such that each of these curved shapes have roughly the same or differing shapes, again depending on the overall shape of the article 90 and desired tensile stress reductions in proximity to these features.

According to another aspect of the disclosure, strengthened articles are provided with multiple compressive stress regions. The multiple stress regions can, according to embodiments, be prepared through differential ion exchange processing conditions. The ion exchange process generally includes one or more ion exchange steps, some of which may be targeted to prominent geometrical features of the article that are nominally susceptible to the development of high tensile stresses, including edges and corners, through the masking of other regions of the article during submersion in one or more strengthening baths. For differential ion exchange processes utilizing multiple strengthening baths, the baths can have the same composition or may employ differing compositions, depending on the desired differential stress profile desired in the final, strengthened article. The compressive stress regions that result from the differential ion exchange processes serve to reduce and minimize the maximum tensile stresses observed in proximity to the edges and corners of the article (and other prominent geometrical features), thus improving their relative strength and the overall reliability of the article.

Referring again to FIGS. 1, 1A and 1B, a strengthened article 100c is provided with multiple compressive stress regions. Like-numbered elements employed in the strengthened article 100c and article 100 have the same or a similar configuration, unless otherwise noted in this disclosure. In one aspect, a strengthened article 100c is provided that includes an article 90 having a glass, glass-ceramic or ceramic composition, a plurality of primary surfaces 12, 14, edges 42, 44, corners 32, and a thickness 54. The strengthened article 100c includes a primary compressive stress region 50 extending from one of the primary surfaces, 12, 14 to a first selected depth in the article 52. In certain implementations, the first selected depth 52 of the primary compressive stress region 50 is substantially constant within the volume of the article 90 beneath the primary surfaces 12, 14. As such, the primary compressive stress region 50 can substantially extend beneath the primary surfaces 12, 14 to the side faces 22 and 24. In other aspects, the primary compressive stress region 50 can generally extend beneath the primary surfaces 12, 14 toward the side faces 22, 24, but not flush with them.

Referring again to FIGS. 1, 1A and 1B, the article 100c further includes one or more edge compressive stress regions 60 extending from each of the edges 42, 44 and/or corners 32, 34 to a second selected depth 62 within the article (see FIGS. 1A and 1B) in the article. As depicted in FIGS. 1A and 1B, the edge compressive stress region 60 can possess a substantially constant second selected depth 62 from the side faces 22, 24 such that the edge compressive stress region 60 extends toward the centroid of the article 90. In other implementations, the second selected depth 62 can vary within the article 90, reflective of various processes that can be used to create the edge compressive stress region 60 (e.g., by an ion exchange process that submerses an article 90 with all or portions of the primary surfaces 12, 14 masked, exposing one or more side faces 22, 24). It should also be understood that regions within the article 90 can have overlapping volumetric regions with compressive stresses influenced by both of the primary and edge compressive stress regions 50 and 60, respectively.

In a particular aspect of the strengthened article 100c, the maximum compressive stress in the primary compressive stress region 50 is about 700 MPa or more and the first selected depth 52 is between about 1% and 10% of the thickness of the article. In other implementations of the strengthened article 100c (i.e., strengthened articles containing both primary and edge compressive stress regions), the maximum compressive stress in the primary compressive stress region 50 is about 500 MPa or greater, 550 MPa or greater, 600 MPa or greater, 650 MPa or greater, 700 MPa or greater, 750 MPa or greater, 800 MPa or greater, 850 MPa or greater, 900 MPa or greater, 950 MPa or greater, and even up to 1000 MPa or greater. Such strengthened articles 100c also can possess an edge compressive stress region 60 with a maximum compressive stress of about 400 MPa or less. In certain aspects, the edge compressive stress region 60 has a maximum compressive stress of about 500 MPa or less, 450 MPa or less, 400 MPa or less, 350 MPa or less, 300 MPa or less, 250 MPa or less, 200 MPa or less, 150 MPa or less, and 100 MPa or less. Other implementations of the strengthened articles 100c exhibit one or more edge compressive stress regions 60 having a maximum compressive stress at a level comparable to the compressive stress levels in the primary compressive stress region 50, e.g., at about 500 MPa or greater, 550 MPa or greater, 600 MPa or greater, 650 MPa or greater, 700 MPa or greater, 750 MPa or greater, 800 MPa or greater, 850 MPa or greater, 900 MPa or greater, 950 MPa or greater, and even up to 1000 MPa or greater.

A typical process for developing the multiple compressive stress regions in the strengthened article 100c according to an aspect of the disclosure includes the steps: (a) immersing or submersing the article 90 (e.g., a substrate with an alkali aluminosilicate glass composition comprising a first metal ion) in a molten salt bath comprising at least one salt of a second metal, in which cations of the second metal are larger than the first metal cations; and (b) ion exchanging the cations of the second metal from the molten salt bath for the first metal cations in the alkali aluminosilicate glass at a temperature of greater than about 420° C. and at least about 30° C. below the anneal point of the glass. The ion exchanging is conducted for a duration sufficient to develop a region of compressive stress (CS) into the glass. These steps can be performed in the first instance, and/or repeated, on the article 90 with particular regions of the substrate masked. It should also be understood that steps for removing or adding masks or other barrier materials are conducted external to the ion exchange baths. Further, the salt bath composition, temperature and ion exchange duration in each of these sequences (i.e., with the article unmasked or having one or more regions masked) can be held constant or may be varied to achieve multiple compressive stress regions within the strengthened article. Together, these compressive stress regions can serve to minimize and reduce the maximum principal stresses (in tension) observed in proximity to the edges and corners of the strengthened article 100c.

Various differential ion exchange processing schemes are contemplated by the disclosure to effect a reduction in maximum tensile stress in proximity the edges and corners of the strengthened articles. Depending on the application environment (e.g., high frequency of drop impacts, flexing, point contacts, abrasion, etc.) for the strengthened article, various maximum compressive stress levels and DOL levels can be advantageous in particular regions of the article, while maintaining relatively low maximum tensile stress levels in substantial proximity to the edges and corners of the substrate. Exemplary differential ion exchange processing schemes are depicted in FIGS. 6A-6C that account for various application environments.

Referring to FIG. 6A, a method is depicted for chemically strengthening a glass article differentially (i.e. partially and sequentially) to create a preferred stress profile through the thickness, edges and corners of the article that achieves a good balance in flexural strength for the article and impact-resistance for its primary surfaces, edges and corners. First, a glass article is cut and cleaned thoroughly, and then part of the article is covered with a barrier. The barrier is made of a material that is inert to a chosen salt bath (e.g., an indium tin oxide (ITO) coating), and can be coated, printed and/or otherwise attached as a thin film on one or more parts of the glass article. The covered glass article is then immersed in a first salt bath at a first temperature for a predetermined duration. The uncovered part of the glass and glass article is chemically strengthened to a particular compressive stress profile. Next, the barrier is removed from the partially strengthened glass article.

Referring again to FIG. 6A, at this stage, the partially strengthened glass article is optionally placed in a second salt bath and subjected to an immersion at a second bath temperature for a predetermined duration. In some aspects, the second salt bath composition, temperature and duration may be the same as the first salt bath composition, temperature and duration. In other aspects, one or more of the second salt bath composition, temperature and duration may be varied relative to the parameters associated with the first salt bath. After the optional immersion in the second salt bath has been completed, an optional annealing step can be conducted on the glass article according to a heat treatment profile selected at least in part based on the composition of the glass article. For example, a glass article strengthened according to the conditions set forth in FIG. 6A with a Corning® Gorilla Glass® composition can be heat treated between about 510° C. and 550° C. for about 1 minute to about 5 hours. Heat treatments can be employed to control the final retained strength and strength variability of strengthened glass article.

Referring to FIG. 6B, a method is depicted for chemically strengthening a glass article differentially to create a preferred stress profile through the thickness, edges and corners of the article that achieves a good balance of flexural strength for the article and impact resistance for its primary surfaces, edges and corners. First, a glass article is cut and cleaned thoroughly, and then the article is immersed in a first salt bath at a first temperature for a predetermined duration. The entire glass article is thus chemically strengthened with a designed compressive stress profile.

Referring again to FIG. 6B, a part of the glass article is now covered with a barrier. The barrier is made of materials that are inert to the chosen salt bath composition, and can be coated, printed and/or otherwise attached as a thin film on part of the glass article. The masked glass article is placed in a second salt bath at a second temperature for a predetermined duration to chemically strengthen the unmasked portion of the glass article until a final, designed compressive stress profile is created over the entire article. In some aspects, the final, designed compressive stress profile includes a compressive stress profile associated with the primary surfaces of the article and an edge compressive stress profile associated with one or more edges and/or corners of the glass article. In some aspects, the second salt bath composition, temperature and duration may be the same as the first salt bath composition, temperature and duration. In other aspects, one or more of the second salt bath composition, temperature and duration may be varied relative to the parameters associated with the first salt bath.

After the immersion in the second salt bath has been completed according to the method depicted in FIG. 6B, the barrier is removed from the strengthened glass article. An optional annealing step can now be conducted on the glass article according to a heat treatment profile selected at least in part based on the composition of the glass article. The annealing step conducted in connection with the process conditions depicted in FIG. 6B is consistent with the optional annealing step associated with the method depicted in FIG. 6A. For example, a glass article strengthened according to the conditions set forth in FIG. 6B with a Corning® Gorilla Glass® composition can be heat treated between about 510° C. and 550° C. for about 1 minute to about 5 hours.

As shown in FIG. 6C, another method is depicted for chemically strengthening a glass article differentially (to create a preferred stress profile through the thickness, edges and corners of the article that achieves a good balance in flexural strength for the article and impact-resistance for its primary surfaces, edges and corners. First, a glass article is cut and cleaned thoroughly, and then part of the article is covered with a barrier. The barrier is made of a material that is inert to a chosen salt bath (e.g., an indium tin oxide (ITO) coating), and can be coated, printed and/or otherwise attached as a thin film on one or more parts of the glass article. The covered glass article is then immersed in a first salt bath at a first temperature for a predetermined duration. The uncovered part of the glass and glass article is chemically strengthened to a particular compressive stress profile. Next, the barrier is removed from the partially strengthened glass article.

Referring again to FIG. 6C, a part of the glass article is now covered with a barrier. The barrier is made of materials that are inert to the chosen salt bath composition, and can be coated, printed and/or otherwise attached as a thin film on part of the glass article. The masked glass article is placed in a second salt bath at a second temperature for a predetermined duration to chemically strengthen the unmasked portion of the glass article until a final, designed compressive stress profile is created over the entire article. In some aspects, the final, designed compressive stress profile includes a compressive stress profile associated with the primary surfaces of the article and an edge compressive stress profile associated with one or more edges and/or corners of the glass article. In some aspects, the second salt bath composition, temperature and duration may be the same as the first salt bath composition, temperature and duration. In other aspects, one or more of the second salt bath composition, temperature and duration may be varied relative to the parameters associated with the first salt bath.

After the immersion in the second salt bath has been completed according to the method depicted in FIG. 6C, the barrier is removed from the strengthened glass article. An optional annealing step can now be conducted on the glass article according to a heat treatment profile selected at least in part based on the composition of the glass article. The annealing step conducted in connection with the process conditions depicted in FIG. 6C is consistent with the optional annealing step associated with the methods depicted in FIGS. 6A and 6B.

According to a further aspect of the disclosure, a method of making a strengthened article (e.g., strengthened article 100c) involving a differential ion exchange process is provided (hereinafter "Example 1"). This method is also consistent with the method depicted in FIG. 6A, described earlier. In particular, the method includes the step: providing an article (e.g., article 90) having a glass, glass-ceramic or ceramic composition with a plurality of ion-exchangeable alkali metal ions, the article further defined by a plurality of primary surfaces, edges and corners, and a thickness. The method also includes the steps: providing a first ion-exchange bath comprising a plurality of first ion-exchanging alkali metal ions, each having a larger size than the size of the ion-exchangeable alkali metal ions; masking each of the edges and corners of the article with an ion-exchange barrier material; submersing the masked article in the first ion-exchange bath at a first ion-exchange temperature and duration to form a primary compressive stress region extending from one of the primary surfaces to a first selected depth in the article; and removing the barrier material from the article. In addition, the maximum compressive stress in the region is about 800 MPa or more and the first selected depth is between about 1% and 10% of the thickness of the article.

Figure 7A:
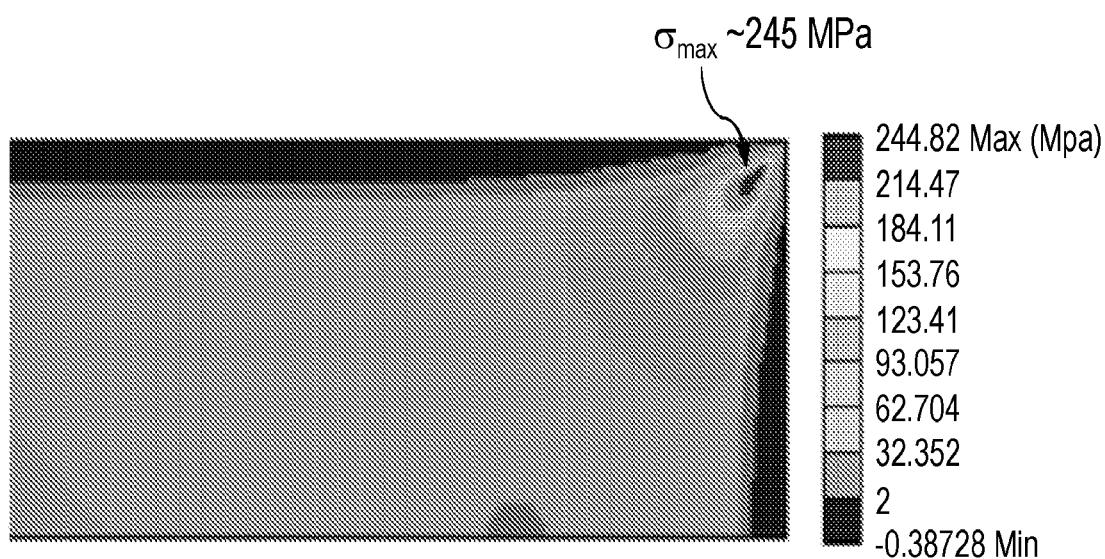
FIGS. 7A-7D are schematic, cross-sectional plots of the stress profiles of strengthened articles subjected to four respective ion exchange strengthening process conditions according to further aspects of the disclosure.

A conventional article produced according to the foregoing method, without a masking step, can exhibit a maximum compressive stress of about 900 MPa at its primary surfaces, with a DOL of about 45 μm when the thickness of the article is about 0.8 mm (hereinafter referred to as the "Comparative Example"). Such an article would be processed according to the foregoing method using a 2.1-hour ion exchange at a temperature of 420° C. in a bath having greater than about 99.4% of $KNO_3$ and 0.6% of $NaNO_3$ by weight. In this example, as well as other aforementioned examples, the ion-exchanged glass is an alumino-silicate glass having some $P_2O_5$ in the composition to promote fast ion exchange. Notably, the Comparative Example would exhibit a relatively high maximum tensile stress of about 240 MPa in proximity to its corners, as exemplified by the stress profile depicted in FIG. 7A.

Figure 7B:
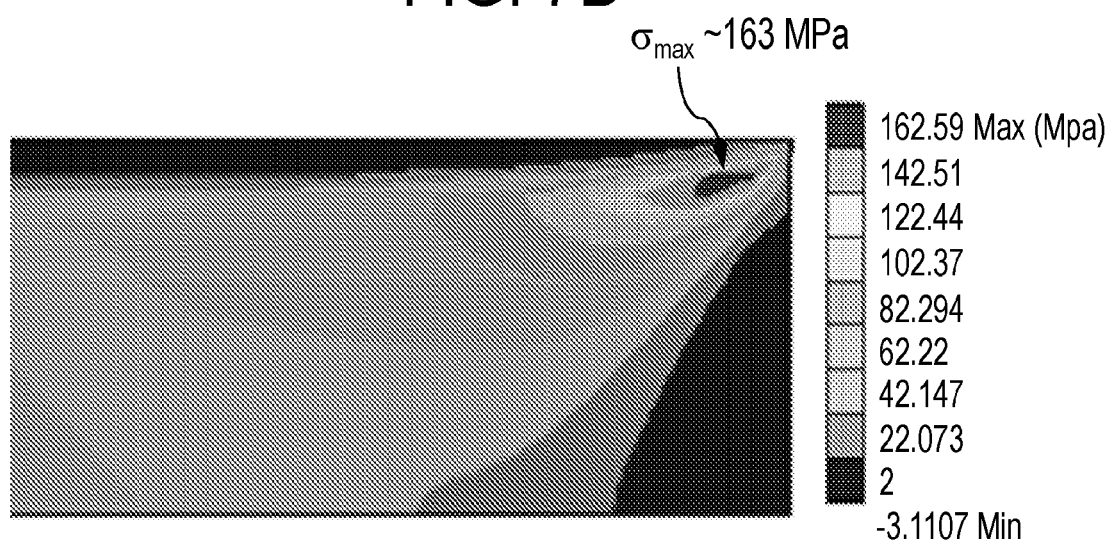

In contrast, a strengthened article 100c produced specifically according to the foregoing Example 1 method (i.e., with the specified masking of the side faces) according to the same bath composition, temperature and duration as the Comparative Example (see the preceding paragraph) exhibits a maximum tensile stress of about 165 MPa in proximity to one of its corners, as exemplified by the stress profile depicted in FIG. 7B. This represents an approximate 30% reduction in the maximum tensile stress observed at the corner of the article. In addition, such an article 100c would exhibit a maximum compressive stress of about 900 MPa at its primary surfaces, with a DOL of about 45 μm. Because the side faces of the article 100c are not exposed to the salt bath, the compressive stress along the side faces of the article varies from a maximum value of about 316 MPa at the edges down to a minimum value of about 77 MPa along the center line of the side face.

More generally, a strengthened article 100c (see FIG. 1) produced according to the Example 1 method can include an article 90 having a glass, glass-ceramic or ceramic composition, a plurality of primary surfaces 12, 14, edges 42, 44, corners 32, 34, and a thickness 54. The article 90 also includes a primary compressive stress region 50 extending from one of the primary surfaces 12, 14 to a first selected depth 52 in the article; and an edge compressive stress region 60 (see FIGS. 1A and 1B) extending from each of the edges and corners to a second selected depth 62 in the article. The maximum compressive stress in the primary compressive stress region 50 is about 800 MPa or less and the first selected depth 52 is between about 1% and 10% of the thickness of the article. In addition, the maximum compressive stress in the edge compressive stress region 60 is about 400 MPa or less. Such strengthened articles 100c can exhibit a maximum principal stress (in tension) of about 120 MPa or less in proximity to its corners and edges.

According to a further aspect of the disclosure, a method of making a strengthened article (e.g., strengthened article 100c) involving a differential ion exchange process is provided (hereinafter "Example 2"). This method is also consistent with the method depicted in FIG. 6B, described earlier. The method includes the step: providing an article (e.g., an article 90) having a glass, glass-ceramic or ceramic composition with a plurality of ion-exchangeable alkali metal ions, the article further defined by a plurality of primary surfaces, edges and corners, and a thickness. The method also includes the steps: providing a first ion-exchange bath comprising a plurality of ion-exchanging alkali metal ions, each having a larger size than the size of the ion-exchangeable alkali metal ions; and a second ion-exchange bath comprising a plurality of ion-exchanging alkali metal ions, each having a larger size than the size of the ion-exchangeable alkali metal ions.

The Example 2 method further includes a step of submersing the unmasked article in the first ion-exchange bath at a first ion-exchange temperature and duration to form an initial compressive stress region extending from one of the primary surfaces to a first selected depth in the article. The article is now removed from the first ion-exchange bath. Next, the method includes the steps: masking each of the edges and corners of the article having the initial compressive stress region with an ion-exchange barrier material; submersing the masked article in the second ion-exchange bath at a second ion-exchange temperature and duration to form a primary compressive stress region extending from one of the primary surfaces to a second selected depth in the article; and removing the barrier material from the article after its submersion in the second ion-exchange bath. In addition, the maximum compressive stress in the primary compressive stress region is about 700 MPa or more and the second selected depth is between about 1% and 10% of the thickness of the article.

Figure 7C:
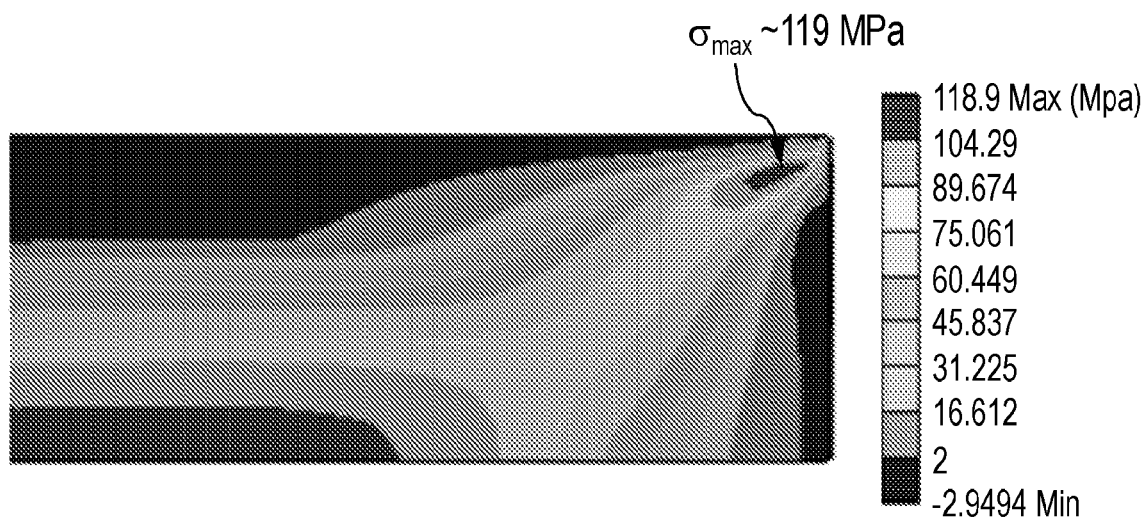

A strengthened article 100c produced according to the foregoing Example 2 method according to the same bath composition, temperature and duration as the Comparative Example exhibits a maximum tensile stress of 119 MPa, as exemplified by the stress profile depicted in FIG. 7C. This represents a significant reduction in the maximum tensile stress observed at the corner of the article in comparison to an article prepared according to the Comparative Example method (i.e., about 240 MPa (see FIG. 7A) vs. 119 MPa). In addition, the strengthened article 100c produced according to the Example 2 method exhibits a maximum compressive stress at the primary surfaces of about 812 MPa and a depth of compressive stress layer (DOL) of about 170 μm from all of its primary surfaces. In sum, the article 100c produced according to the Example 2 method significantly reduces the maximum tensile stresses at the corner of the article while exhibiting an advantageously high degree of surface compression on the top and bottom primary surfaces, with a deep DOL along the side faces.

More generally, a strengthened article 100c produced according to the Example 2 method can include an article 90 having a glass, glass-ceramic or ceramic composition, a plurality of primary surfaces 12, 14, edges 42, 44, corners 32, 34, and a thickness 54. The article 90 also includes a primary compressive stress region 50 extending from one of the primary surfaces 12, 14 to a first selected depth 52 in the article; and an edge compressive stress region 60 (see FIGS. 1A and 1B) extending from each of the edges and corners to a second selected depth 62 in the article. The maximum compressive stress in the primary compressive stress region 50 is about 700 MPa or less and the first selected depth is between about 1% and 10% of the thickness of the article. In addition, the maximum compressive stress in the edge compressive stress region 60 is about 500 MPa or less.

In another embodiment, a method of making a strengthened article (e.g., strengthened article 100c) involving a differential ion exchange process is provided (hereinafter "Example 3"). The method includes the step: providing an article (e.g., an article 90 having a glass, glass-ceramic or ceramic composition with a plurality of ion-exchangeable alkali metal ions, the article further defined by a plurality of primary surfaces, edges and corners, and a thickness. The method also includes the steps: providing a first ion-exchange bath comprising a plurality of ion-exchanging alkali metal ions (e.g., $K^+$ ions), each having a larger size than the size of the ion-exchangeable alkali metal ions (e.g., $Na^+$ ions); and a second ion-exchange bath comprising a plurality of ion-exchanging alkali metal ions, each having a larger size than the size of the ion-exchangeable alkali metal ions. The method further includes the steps: masking each of the edges and corners of the article with an ion-exchange barrier material (e.g., an ITO layer); submersing the masked article in the first ion-exchange bath at a first ion-exchange temperature and duration to form a primary compressive stress region extending from one of the primary surfaces to a first selected depth in the article; and removing the barrier material from the article having the primary compressive stress region after removing the article from the first ion-exchange bath.

The Example 3 method further includes the steps: masking the primary surfaces of the article (e.g., article 90) having the primary compressive stress region with an ion-exchange barrier material; submersing the entire article having the masked primary surfaces in the second ion-exchange bath at a second ion-exchange temperature and duration to form an edge compressive stress region extending from each of the corners and edges of the article to a second selected depth in the article; and removing the barrier material from the article after its submersion in the second ion-exchange bath. In addition, the maximum compressive stress in the primary compressive stress region is about 700 MPa or more and the first selected depth is at least 10% of the thickness of the article.

Figure 7D:
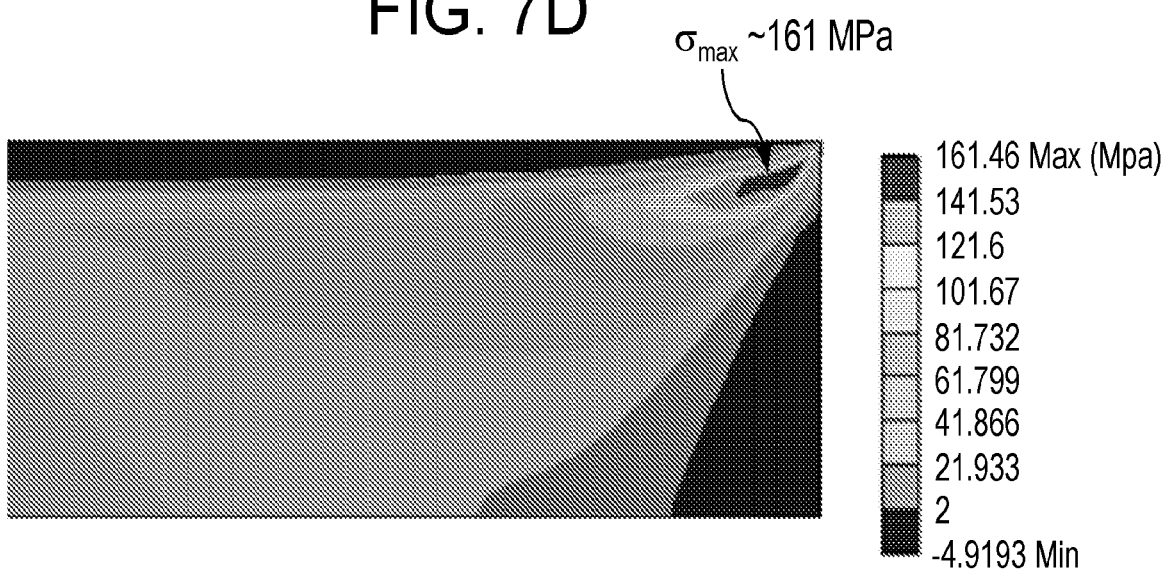

A strengthened article 100c produced according to the foregoing Example 3 method according to the same bath composition, temperature and duration as the Comparative Example exhibits a maximum tensile stress of 161 MPa, as exemplified by the stress profile depicted in FIG. 7D. This represents a significant reduction in the maximum tensile stress observed at the corner of the article in comparison to an article prepared according to the Comparative Example method (i.e., about 240 MPa (see FIG. 7A) vs. 161 MPa). In addition, the strengthened article 100c produced according to the Example 3 method exhibits a maximum compressive stress at the primary surfaces of the article of about 800 MPa and a depth of compressive stress layer (DOL) of about 45 µm. Further, the article 100c produced according to the Example 3 method exhibits a maximum compressive stress at the side faces of the article of about 1000 MPa. In sum, the article 100c produced according to the Example 3 method significantly reduces the maximum tensile stresses at the corner of the article while exhibiting an advantageously high degree of surface compression on the top and bottom primary surfaces, along with its side faces.

More generally, a strengthened article 100c produced according to the Example 3 method can include an article 90 having a glass, glass-ceramic or ceramic composition, a plurality of primary surfaces 12, 14, edges 42, 44, corners 32, 34, and a thickness 54. The article 90 also includes a primary compressive stress region 50 extending from one of the primary surfaces 12, 14 to a first selected depth 52 in the article 90; and an edge compressive stress region 60 extending from each of the edges and corners to a second selected depth 62 in the article. The maximum compressive stress in the primary compressive stress region is about 700 MPa or less and the first selected depth is between about 1% and 10% of the thickness of the article. In addition, the maximum compressive stress in the edge compressive stress region is about 700 MPa or greater.

Strengthened articles 100c produced according to the foregoing methods exemplified by Examples 1-3 my include an article 90 having a substantially transparent substrate with a glass composition with a thickness 54 ranging from about 0.4 mm to about 1 mm. As outlined earlier (see FIG. 3B), the edges and corners of the strengthened article 100c may also be defined by a fillet-like or spline-like contour, e.g., at an average radius of 0.1 mm or greater.

In some aspects, the strengthened articles 100c produced according to the methods detailed in Examples 1-3 are defined by a maximum tensile stress in substantial proximity to one or more of its corners (e.g., corners 32, 34) and edges (e.g., edges 42, 44) of 200 MPa or less. In some embodiments, a maximum tensile stress in substantial proximity to the edges and corners of the article 100c does not exceed 100 MPa.

With regard to the foregoing methods detailed in Examples 1-3 to fabricate strengthened articles 100c, suitable ion exchange temperatures, durations and strengthened bath compositions can be derived from the disclosure outlined earlier in connection with the methods employed to develop the strengthened articles 100. For example, the foregoing methods can employ an ion exchange temperature that ranges from about 400° C. to 450° C. with an ion exchange duration set between about 3 and 15 hours, and a bath composition that includes 100% molten $KNO_3$ (by weight). In another example, the foregoing methods can employ a second ion exchange temperature that ranges from about 460° C. to 520° C. with an ion exchange duration set between about 30 minutes and about 5 hours, and a bath composition that includes 97 to 99% molten $KNO_3$ and 1 to 3% molten $KSO_4$ (by weight).

Figure 8A:
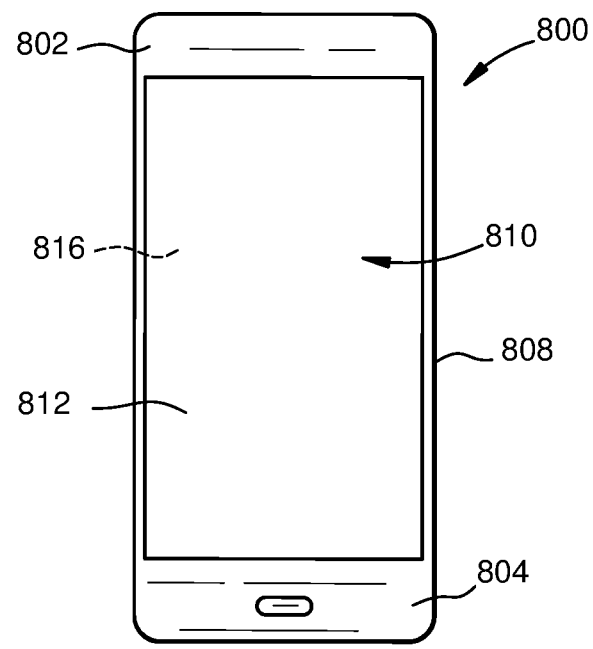
FIG. 8A is a plan view of an exemplary electronic device incorporating a strengthened article.
Figure 8B:
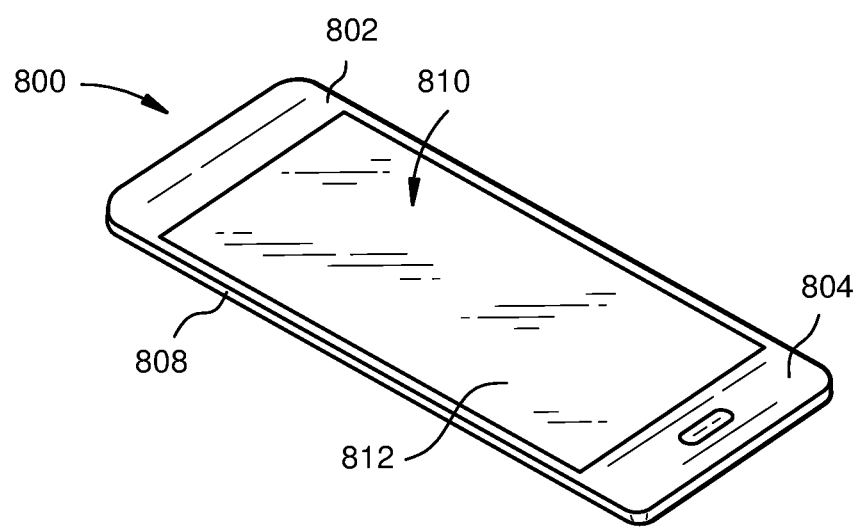
FIG. 8B is a perspective view of the exemplary electronic device of FIG. 8A.

The strengthened articles disclosed herein may be incorporated into another article such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any of the strengthened articles disclosed herein is shown in FIGS. 8A and 8B. Specifically, FIGS. 8A and 8B show a consumer electronic device 800 including a housing 802 having front 804, back 806, and side surfaces 808; electrical components (not shown) that are at least partially inside or entirely within the housing and including at least a controller, a memory, and a display 810 at or adjacent to the front surface of the housing; and a cover substrate 812 at or over the front surface of the housing such that it is over the display. In some embodiments, the cover substrate 812 may include any of the strengthened articles disclosed herein.

It should be understood that the foregoing methods to produce strengthened articles with corners and edges having enhanced strength are exemplary. For example, the foregoing principles can be employed to optimize the amount of compressive stress and DOL levels at various locations in the article through differential ion exchange processing, including masking particular corners, side faces, edges and primary surfaces of the article, depending on the expected application environment for the article. At the same time, these compressive stress and DOL characteristics can be obtained in these articles while maintaining enhanced strength for prominent geometric features of the article, including its corners, edges and side faces, via a reduction in maximum tensile stress in substantial proximity to these features.

It will be apparent to those skilled in the art that various modifications and variations to the articles and methods of the disclosure can be made without departing from the spirit or scope of the claims.

What is claimed is:

1. A strengthened article, comprising:
a glass, glass-ceramic or ceramic, having a plurality of primary surfaces, a plurality of side edges, and a thickness;
a compressive stress region extending from one of the primary surfaces to a first selected depth in the article;
a central region extending from a boundary located at a depth of 200 μm from the primary surfaces and the edges to the centroid of the article; and
an outer region extending between the primary surfaces and side edges to the boundary,
wherein the maximum principal stress in tension within the outer region is no more than two times the maximum principal stress in tension within the central region.

2. The article of claim 1, wherein a maximum compressive stress in the compressive stress region is about 400 MPa or less and the first selected depth is at least 8% of the thickness of the article.

3. The article of claim 1, wherein the compressive stress region is formed from an ion exchange process and comprises a plurality of exchanged alkali metal ions.

4. The article of claim 1, wherein the article comprises a substantially transparent substrate having a glass composition, and the thickness ranges from about 0.4 mm to 1 mm.

5. The article of claim 1, wherein the primary surfaces and side edges define a plurality of corners, and further wherein a maximum tensile stress in substantial proximity to the side edges and corners that results from a process for forming the compressive stress region does not exceed 200 MPa.

6. The article of claim 1, wherein the primary surfaces and side edges define a plurality of corners, and further wherein a maximum tensile stress in substantial proximity to the side edges and corners that results from a process for forming the compressive stress region does not exceed 100 MPa.

7. The article of claim 1, wherein the primary surfaces and side edges define a plurality of corners, and further wherein the corners are defined by a chamfer, a fillet having an average radius of about 5% to 50% of the thickness, or a curved shape having at least one radius of curvature between about 5% and 100% of the thickness.

8. A strengthened article, comprising:
a glass, glass-ceramic or ceramic, having a plurality of primary surfaces, a plurality of side edges, and a thickness;
a primary compressive stress region extending from one of the primary surfaces to a first selected depth in the article;
a central region extending from a boundary located at a depth of 200 μm from the primary surfaces and the edges to the centroid of the article;
an outer region extending between the primary surfaces and side edges of the article to the boundary; and
an edge compressive stress region extending from each of the side edges to a second selected depth in the article,
wherein a maximum compressive stress in the primary compressive stress region is about 700 MPa or more and the first selected depth is between about 1% and 10% of the thickness of the article, and
further wherein the maximum principal stress in tension within the outer region is no more than two times the maximum principal stress in tension within the central region.

9. The article of claim 8, wherein the maximum compressive stress in the edge compressive stress region is about 400 MPa or less.

10. The article of claim 8, wherein the maximum compressive stress in the edge compressive stress region is about 500 MPa or less.

11. The article of claim 8, wherein the maximum compressive stress in the edge compressive stress region is about 700 MPa or greater.

12. The article of claim 8, wherein the compressive stress regions are formed from one or more ion exchange processes and comprise a plurality of exchanged alkali metal ions.

13. The article of claim 8, wherein the article comprises a substantially transparent substrate having a glass composition, and the thickness ranges from about 0.4 mm to 1 mm.

14. The article of claim 8, wherein the primary surfaces and side edges define a plurality of corners, and further wherein a maximum tensile stress in substantial proximity to the side edges and corners that results from a process for forming the compressive stress region does not exceed 200 MPa.

15. The article of claim 8, wherein the primary surfaces and side edges define a plurality of corners, and further wherein a maximum tensile stress in substantial proximity to the side edges and corners that results from a process for forming the compressive stress region does not exceed 100 MPa.

16. The article of claim 8, wherein the primary surfaces and side edges define a plurality of corners, and further wherein the corners are defined by a chamfer, a fillet having an average radius of about 5% to 50% of the thickness, or a curved shape having at least one radius of curvature between about 5% and 100% of the thickness.

17. A method of making a strengthened article, comprising the steps of:
providing an article having a glass, glass-ceramic or ceramic composition with a plurality of ion-exchangeable alkali metal ions, the article further defined by a plurality of primary surfaces, a plurality of side edges, and a thickness;
providing a first ion-exchange bath comprising a plurality of ion-exchanging alkali metal ions, each having a larger size than the size of the ion-exchangeable alkali metal ions; and
submersing the article in the first ion-exchange bath at a first ion-exchange temperature and duration to form a compressive stress region extending from one of the primary surfaces to a first selected depth in the article,
wherein the article further comprises: (a) a central region extending from a boundary located at a depth of 200 μm from the primary surfaces and the edges to the centroid of the article, and (b) an outer region extending between the primary surfaces and side edges of the article to the boundary, and further wherein the maximum principal stress in tension within the outer region is no more than two times the maximum principal stress in tension within the central region.

18. The method of claim 17, wherein a maximum compressive stress in the compressive stress region is about 400 MPa or less and the first selected depth is at least 8% of the thickness of the article.

19. The method of claim 17, wherein a maximum compressive stress in the compressive region is about 200 MPa or less.

20. The method of claim 17, wherein the article comprises a substantially transparent substrate having a glass composition, and the thickness ranges from about 0.4 mm to 1 mm.

21. The method of claim 17, wherein the first ion exchange temperature ranges from about 400° C. to 450° C. and the first ion exchange duration is between about 3 and 15 hours.

22. The method of claim 17, further comprising the steps of:

masking each of the side edges of the article with an ion-exchange barrier material prior to submersing the article in the first ion-exchange bath;
removing the barrier material from the article.

23. The method of claim 22, wherein a maximum compressive stress in the primary compressive stress region is about 800 MPa or more and the first selected depth is between about 1% and 10% of the thickness of the article.

24. The method of claim 22, wherein the article comprises a substantially transparent substrate having a glass composition, and the thickness ranges from about 0.4 mm to 1 mm.

25. The method of claim 22, wherein the first ion exchange temperature ranges from about 460° C. to 520° C. and the first ion exchange duration is between about 30 minutes and about 5 hours.

26. The method of claim 17, further comprising the steps of:

providing a second ion-exchange bath comprising a plurality of ion-exchanging alkali metal ions, each having a larger size than the size of the ion-exchangeable alkali metal ions;
masking each of the side edges of the article having the initial compressive stress region with an ion-exchange barrier material;
submersing the masked article in the second ion-exchange bath at a second ion-exchange temperature and duration to form a primary compressive region extending from one of the primary surfaces to a second selected depth in the article; and
removing the barrier material from the article.

27. The method of claim 26, wherein a maximum compressive stress in the primary compressive stress region is about 700 MPa or more and the second selected depth is between about 1% and 10% of the thickness of the article.

28. The method of claim 26, wherein the article comprises a substantially transparent substrate having a glass composition, and the thickness ranges from about 0.4 mm to 1 mm.

29. The method of claim 26, wherein the first ion exchange temperature ranges from about 400° C. to 450° C. and the first ion exchange duration is between about 3 and 15 hours, and further wherein the first ion exchange bath comprises 100% molten $KNO_3$ (by weight).

30. The method of claim 26, wherein the second ion exchange temperature ranges from about 460° C. to 520° C. and the second ion exchange duration is between about 30 minutes and about 5 hours, and further wherein the second ion exchange bath comprises 97 to 99% molten $KNO_3$ and 1 to 3% molten $KSO_4$ (by weight).

31. The method of claim 17, further comprising the steps of:

providing a second ion-exchange bath comprising a plurality of ion-exchanging alkali metal ions, each having a larger size than the size of the ion-exchangeable alkali metal ions;
masking each of the side edges of the article with an ion-exchange barrier material prior to submersing the article in the first ion-exchange bath;
removing the barrier material from the article having the primary compressive stress region;
masking the primary surfaces of the article having the primary compressive stress region with an ion-exchange barrier material;
submersing the article having the masked primary surfaces in the second ion-exchange bath at a second ion-exchange temperature and duration to form an edge compressive stress region extending from each of the edges and corners to a second selected depth in the article; and
removing the barrier material from the article having the edge compressive stress region.

32. The method of claim 31, wherein a maximum compressive stress in the primary compressive stress region is about 700 MPa or more and the first selected depth is at least 10% of the thickness of the article.

33. The method of claim 31, wherein the article comprises a substantially transparent substrate having a glass composition, and the thickness ranges from about 0.4 mm to 1 mm.

34. The method of claim 31, wherein the first ion exchange temperature ranges from about 460° C. to 520° C. and the first ion exchange duration is between about 30 minutes and about 5 hours, and further wherein the first ion exchange bath comprises 97 to 99% molten $KNO_3$ and 1 to 3% molten $KSO_4$ (by weight).

35. The method of claim 31, wherein the second ion exchange temperature ranges from about 460° C. to 520° C. and the second ion exchange duration is between about 30 minutes and about 5 hours, and further wherein the second ion exchange bath comprises 97 to 99% molten $KNO_3$ and 1 to 3% molten $KSO_4$ (by weight).

36. A device, comprising:
a housing having front, back, and side surfaces;
electrical components that are at least partially inside the housing;
a display at or adjacent to the front surface of the housing; and
a cover substrate disposed over the display, wherein the cover substrate comprises the article of claim 1.

37. A device, comprising:
a housing having front, back, and side surfaces;
electrical components that are at least partially inside the housing;
a display at or adjacent to the front surface of the housing; and
a cover substrate disposed over the display, wherein the cover substrate comprises the article of claim 8.

* * * * *